United States Patent
Zohni et al.

(10) Patent No.: US 8,946,901 B2
(45) Date of Patent: Feb. 3, 2015

(54) MICROELECTRONIC PACKAGE AND METHOD OF MANUFACTURE THEREOF

(71) Applicant: Invensas Corporation, San Jose, CA (US)

(72) Inventors: Wael Zohni, San Jose, CA (US); Chung-Chuan Tseng, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 46 days.

(21) Appl. No.: 13/746,571

(22) Filed: Jan. 22, 2013

(65) Prior Publication Data

US 2014/0203440 A1 Jul. 24, 2014

(51) Int. Cl.
*H01L 23/13* (2006.01)
*H01L 21/58* (2006.01)
*H01L 21/56* (2006.01)
*H01L 23/31* (2006.01)

(52) U.S. Cl.
CPC ............... *H01L 23/13* (2013.01); *H01L 21/58* (2013.01); *H01L 21/56* (2013.01); *H01L 23/3128* (2013.01); *H01L 2224/48091* (2013.01); *H01L 2224/4824* (2013.01); *H01L 2924/15311* (2013.01)
USPC .......................................... 257/773; 438/126

(58) Field of Classification Search
CPC .......... H01L 21/56; H01L 23/13; H01L 21/58
USPC .......................................... 257/773; 438/126
See application file for complete search history.

(56) References Cited

U.S. PATENT DOCUMENTS

| 8,338,963 | B2 | 12/2012 | Haba et al. |
| 2003/0100141 | A1 | 5/2003 | Street et al. |
| 2006/0049531 | A1 | 3/2006 | Rumsey |
| 2009/0134504 | A1 | 5/2009 | Lee et al. |
| 2012/0153435 | A1* | 6/2012 | Haba et al. .................... 257/532 |
| 2012/0267798 | A1 | 10/2012 | Haba et al. |
| 2013/0015591 | A1 | 1/2013 | Haba et al. |

OTHER PUBLICATIONS

Partial International Search Report for Application No. PCT/US2014/012475 dated Apr. 22, 2014.
International Search Report and Written Opinion for Application No. PCT/US2014/012475 May 30, 2014.

* cited by examiner

*Primary Examiner* — Walter H Swanson
(74) *Attorney, Agent, or Firm* — Lerner, David, Littenberg, Krumholz & Mentlik, LLP

(57) ABSTRACT

A microelectronic assembly may include a substrate having an opening extending between first and second oppositely facing surfaces of the substrate, the opening elongated in a first direction; and at least one microelectronic element having a front face facing and attached to the first surface of the substrate and a plurality of contacts at the front face overlying the opening, the microelectronic element having first and second opposite peripheral edges extending away from the front face. The first peripheral edge extends beyond, or is aligned in the first direction with, an inner edge of the opening, and the opening extends beyond the second peripheral edge.

23 Claims, 16 Drawing Sheets

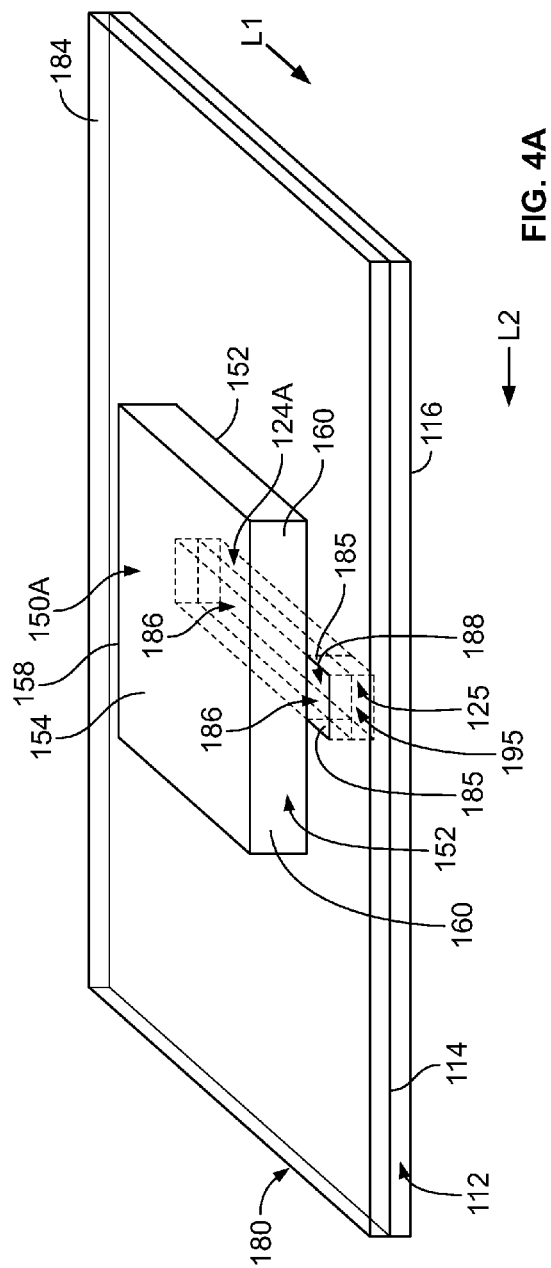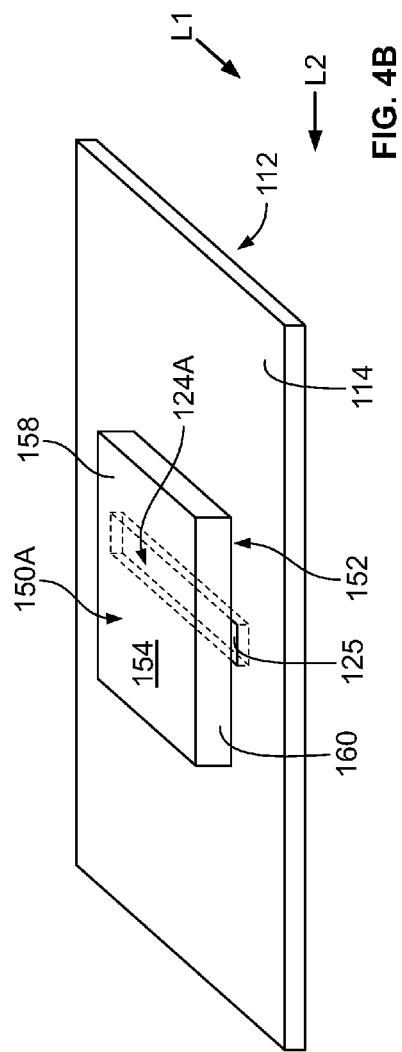

MICROELECTRONIC PACKAGE AND METHOD OF MANUFACTURE THEREOF

FIELD OF THE INVENTION

The present invention relates to microelectronic packages and methods of their manufacture.

BACKGROUND OF THE INVENTION

Microelectronic elements such as semiconductor chips commonly are provided with elements which protect the microelectronic element and facilitate its connection to other elements of a larger circuit. For example, a semiconductor chip typically is provided as a small, flat element having oppositely facing front and rear surfaces and contacts at the front surface. The contacts are electrically connected to the numerous electronic circuit elements formed integrally within the chip. Such a chip most commonly is provided in a package having a miniature circuit panel referred to as a substrate. The chip is typically mounted to the substrate with the front or rear surface overlying a surface of the substrate, and the substrate typically has terminals at a surface of the substrate. The terminals are electrically connected to the contacts of the chip. The package typically also includes some form of covering overlying the chip on the side of the chip opposite from the substrate. The covering serves to protect the chip and, in some cases, the connections between the chip and the conductive elements of the substrate. Such a packaged chip may be mounted to a circuit panel, such as a circuit board, by connecting the terminals of the substrate to conductive elements such as contact pads on the larger circuit panel.

In certain packages, the chip is mounted with its front surface overlying an upper surface of the substrate, whereas terminals are provided on the oppositely facing lower surface. A mass of a dielectric material overlies the chip and, most typically, the electrical connections between the chip and the conductive elements of the substrate. The dielectric mass may be formed by molding a flowable dielectric composition around the chip so that the dielectric composition covers the chip and all or part of the top surface of the substrate. Such a package is commonly referred to as an "overmolded" package, and the mass of dielectric material is referred to as the "overmold." Overmolded packages are economical to manufacture and thus are widely used.

In some applications, it is desirable to mount a plurality of chips 12 overlying an upper surface 14 of a substrate 16 in a face down orientation, such as in a quad face down (QFD) or like orientation as shown in FIG. 1. See, for example, U.S. Pat. No. 8,338,963 issued Oct. 25, 2012 and U.S. Publication No. 2013/0015591 published Jan. 17, 2013, the disclosures of which are incorporated by reference herein. The chips 12 may be attached to the surface 14 by an attachment layer 18, with contacts 22 at the front faces of the chips 12 overlying openings 20 in the substrate 16. The openings 20 have an elongated dimension, extend to the front face of the chip and have portions 24 at opposite ends of the elongated dimension through which dielectric material may flow from an opening in the attachment layer 18 during manufacture of the microelectronic package. In microelectronic packages having chips in QFD and like orientations as shown in FIG. 1, the openings typically are not arranged so the elongated dimension of the openings extends in a same longitudinal direction, as is customary when chips are arranged in a single or dual face down orientation in a microelectronic package. During manufacture of such packages, when encapsulant material is provided to encapsulate the elements of the package, which includes filling the openings with the encapsulant material, the material is typically flowed from a molding tool 30 in a single direction X over the top surface or attachment layer 18 side of the substrate 16. In QFD or like orientations, the openings 20 that extend in a longitudinal direction transverse, such as perpendicular, to the encapsulant material flow direction X may not become completely filled by the encapsulant material, because voids at which air is entrapped may form within the openings, which is undesirable.

Despite the considerable effort devoted in the art to development of microelectronic packages having multiple electronic elements, further improvement would be desirable.

SUMMARY OF THE INVENTION

In accordance with one embodiment, a microelectronic assembly may include a substrate having an opening extending between first and second oppositely facing surfaces of the substrate, the opening elongated in a first direction; and at least one microelectronic element having a front face facing and attached to the first surface of the substrate and a plurality of contacts at the front face overlying the opening, the microelectronic element having first and second opposite peripheral edges extending away from the front face, where the first peripheral edge extends beyond, or is aligned in the first direction with, an inner edge of the opening, and where the opening extends beyond the second peripheral edge.

In accordance with another embodiment, a method of forming a microelectronic assembly may include joining a substrate with a microelectronic element, the substrate having an opening extending between first and second oppositely facing surfaces of the substrate, the opening elongated in a first direction, and the microelectronic element having a front face facing and attached to the first surface of the substrate and a plurality of contacts at the front face overlying the opening, the microelectronic element having first and second opposite peripheral edges extending away from the front face, where the first peripheral edge extends beyond, or is aligned in the first direction with, an inner edge of the opening, and where the opening extends beyond the second peripheral edge.

In accordance with another embodiment, a microelectronic assembly may include a substrate having an opening extending between first and second oppositely facing surfaces of the substrate, the opening elongated in a first direction; and a microelectronic element having a front face facing and attached to the first surface of the substrate and a plurality of contacts at the front face overlying the opening, the microelectronic element having first and second opposite peripheral edges extending away from the front face, where the opening extends beyond at least one of the first or second peripheral edges, and where at least one of the first surface or the second surface of the substrate partially defines at least one vent extending from the opening.

In accordance with another embodiment, a method of forming a microelectronic assembly may include joining a substrate with a microelectronic element, the substrate having an opening extending between first and second oppositely facing surfaces of the substrate, the opening elongated in a first direction, the microelectronic element having a front face facing and attached to the first surface of the substrate and a plurality of contacts at the front face overlying the opening, the microelectronic element having first and second opposite peripheral edges extending away from the front face, where the opening extends beyond at least one of the first and second peripheral edges, and where at least one of the first surface or the second surface of the substrate partially defines at least one vent extending from the opening beyond a peripheral edge of the microelectronic element.

BRIEF DESCRIPTION OF THE DRAWINGS

FIG. 4A is a perspective view of a portion of the microelectronic assembly of FIG. 2.

FIG. 4B is a perspective view of a portion of another microelectronic assembly, according to an embodiment of the disclosure.

DETAILED DESCRIPTION

Figure 2:
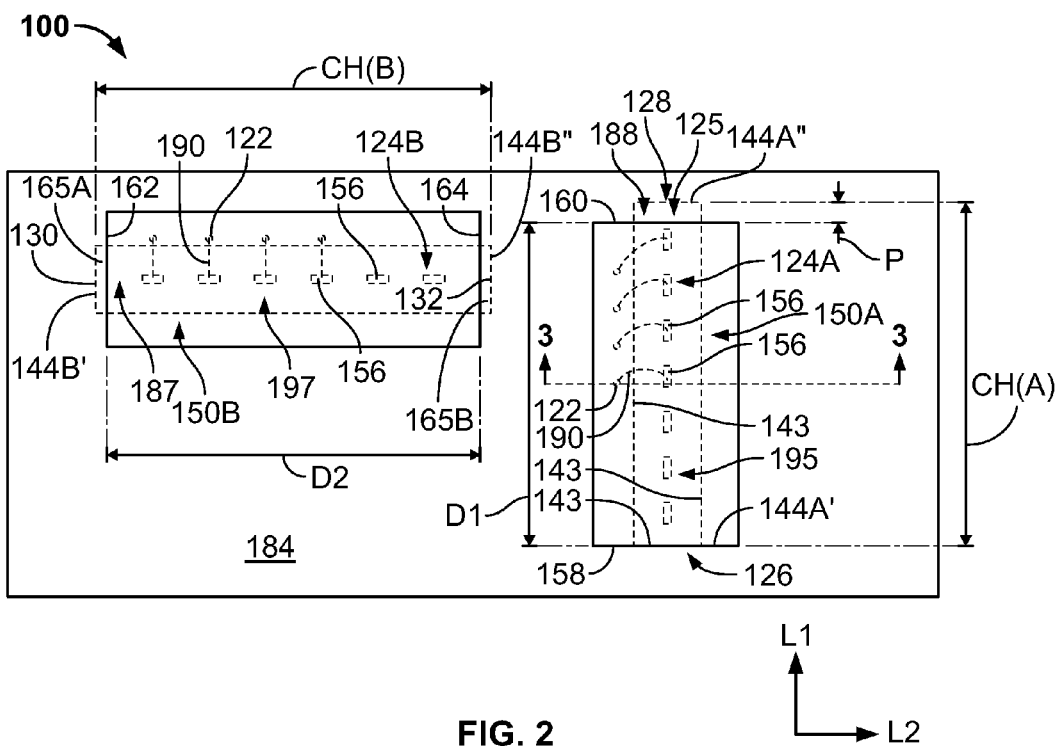
FIG. 2 is a top plan view of a portion of a microelectronic assembly at a stage in manufacturing operations, according to an embodiment of the disclosure.
Figure 3:
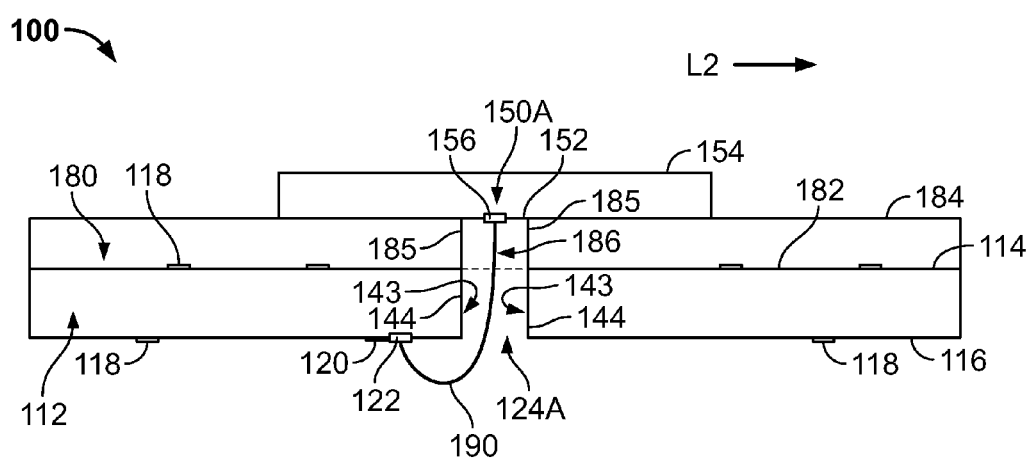
FIG. 3 is a diagrammatic sectional view of the microelectronic assembly as shown in FIG. 2 at cross-sectional line 3-3.

Referring to FIGS. 2, 3 and 4A, a microelectronic assembly 100 according to an embodiment of the disclosure may include a substrate 112 having a first surface 114 and a second surface 116. The substrate 112 typically is in the form of a dielectric element, which is substantially flat and may be sheet-like and thin. In particular embodiments, the dielectric element may include one or more layers of organic dielectric material or composite dielectric materials, such as, without limitation: polyimide, polytetrafluoroethylene ("PTFE"), epoxy, epoxy-glass, FR-4, BT resin, thermoplastic, or thermoset plastic materials. The first surface 114 and second surface 116 are preferably substantially parallel to each other and are spaced apart at a distance perpendicular to the surfaces 114 and 116 defining the thickness of the substrate 112. The thickness of substrate 112 is preferably within a range of generally acceptable thicknesses for the present application. In an embodiment, the distance between the first surface 114 and the second surface 116 is between about 25 and 500 µm. For purposes of this discussion, the first surface 114 may be described as being positioned opposite or remote from the second surface 116. Such a description, as well as any other description of the relative position of elements used herein that refers to a vertical or horizontal position of such elements is made for illustrative purposes only to correspond with the position of the elements within the Figures, and is not limiting.

Electrically conductive elements 118, which may include contacts or pads, traces or terminals, are at the first and second surfaces of the substrate 112. As used in this disclosure, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. In addition, as used in this disclosure a statement that an electrically conductive element is "at" a surface of a circuit panel, a microelectronic element such as a semiconductor chip or a like element, indicates that, when the panel or the element is not assembled with any other element, the electrically conductive element is available for contact with a theoretical point moving in a direction perpendicular to the surface of the panel or element toward the surface of the panel or element from outside the panel or element. Further, as used in this disclosure, a statement that a trace extends "along" a surface means that the trace extends in proximity to the surface and substantially parallel to the surface.

Traces 120 included as the conductive elements 118 may be formed as flat, thin, elongated strips of conductive material at the surface 116. In addition, contact pads 122 included as the conductive elements 118 on the surface 116 may be connected with the traces 120 on the surface 116.

The terminals, pads or traces serving as the conductive elements 118 may be fabricated by numerous known methods, such as by plating the terminals, pads and traces onto the surfaces 114 and 116 of the substrate. In one embodiment, the traces may be embedded in the surfaces of the substrate, with the surfaces of the traces lying substantially flush with the surfaces of the substrate. In one embodiment, the conductive elements 118 may be formed from a solid metal material such as copper, copper, gold, nickel, or other materials that are acceptable for such an application, including various alloys including one or more of copper, gold, nickel or combinations thereof.

At least some of conductive elements at the surface 116 may be interconnected with conductive elements at the surface 114. Such an interconnection may be completed using vias (not shown) formed in the substrate 112 that may be lined or filled with conductive metal that may be of the same material as the conductive elements 118.

Referring to FIG. 2, the substrate 112 may define a plurality of elongated openings, and microelectronic elements 150, such as a semiconductor chip or a like element, may be attached to the substrate and have contacts at front faces thereof overlying the openings, respectively. In the illustrated embodiment, the substrate 112 may define an opening 124A extending from the first surface 114 to the second surface 116 and having an elongated dimension extending a length CH(A) in a direction L1 from a first end 126 to a second end 128 of the opening 124A which is opposite the first end 126. In addition, the substrate 112 may define an opening 124B extending from the first surface 114 to the second surface 116 and having an elongated dimension extending a length CH(B) in a direction L2 transverse, and in one embodiment orthogonal, to the direction L1, from a first end 130 to a second end 132 of the opening 124B which is opposite the first end 130. In one embodiment, the openings 124 are defined by an inner edge 143 of the substrate 112, and the inner edge 143 includes an inner edge surface 144 extending from the surface 114 to the surface 116. In other embodiments, the inner edge surface 144 extends between the surfaces 114 and 116 or from only one of the surfaces 114 and 116. Although not shown in FIG. 2, it is to be understood that the microelectronic assembly 100 may include a plurality of microelectronic elements 150 overlying openings 124 in the substrate having elongated dimensions extending in the directions L1 and L2, respectively.

The microelectronic elements or chips 150 may include opposite first and second surfaces 152, 154, and contacts 156 at the surface 152. The chips 150 may be positioned in a "face-down" orientation relative to the substrate 112, with the surface 152 facing the surface 114 and the contacts 156 of the chip 152 overlying a respective opening 124. In one embodiment, the assembly 100 may include at least one chip 150A having opposite peripheral edges 158 and 160 that extend away from the surface 152, and a major dimension of the chip 150A may extend a length D1 in the direction L1 from the edge 158 to the edge 160.

In addition, the assembly 100 may include at least one chip 150B having opposite peripheral edges 162 and 164 that extend away from the surface 152, and a major dimension of the chip 150B may extend a length D2 in the direction L2 from the edge 162 to the edge 164. In some embodiments, the chips 150A and 150B may have major dimensions of the same length, or a configuration having the same or similar dimensions. For example, the chips 150 may have a rectangular configuration with a major dimension extending between the opposite peripheral edges 158, 160 and 162, 164 and a minor dimension extending in a direction orthogonal to the direction the major dimension extends.

In one embodiment, the contacts 156 of the chips 150A may overlie the corresponding openings 124A, and a single one of the edges 158 and 160, such as the edge 158, is aligned in the direction L1 with an inner edge surface 144A' of the substrate 112 that defines the opening 124A. In another embodiment, the chip 150A may overlie the corresponding opening 124A, and the edge 158 may extend beyond the edge surface 144A' in the direction opposite to L1. In addition, a portion 125 of the opening 124A may extend a length P beyond the edge 160 of the chip 150A in the direction L1, where P is about 50-150 micrometers. Based on the arrangement of the chip 150A overlying the opening 124A, the chip 150A may overlie the entirety of the opening 124A extending from the end 126 in the direction L1 toward the end 128, except for the portion 125 extending beyond the edge 160.

Referring to FIGS. 3 and 4A, the assembly 100 may include an attachment layer 180 that joins the microelectronic elements 150 with the surface 114 of the substrate 112. The attachment layer 180 may be formed of adhesive material, such as a curable adhesive or epoxy dielectric material, that may be selectively deposited by printing, or formed by photomasking and etching, on portions of the surface 114. The attachment layer 180 may include opposite first and second surfaces 182, 184, where the first surface 182 faces the surface 114 and the second surface 184 faces the surface 152 of the chip 150.

In one embodiment as illustrated in FIGS. 2 and 3, the surface 184 of the attachment layer 180 may extend along the surface 152 of the chip 150, and have an inner edge surface 185 extending from the surface 162 to the surface 152 that defines a second opening 186 in the layer 180. Referring to FIGS. 2 and 4A, the second opening 186 may overlie the opening 124A, and a portion 188 of the opening 186 may extend beyond the edge 160 of the chip 150A in the direction L1. The portion 188 of the opening 186 desirably extends from, and is in fluid communication with, the portion 125. In addition, the second opening 186 extends from, and is in fluid communication with, the opening 124A along portions of the opening 124A that the chip 150A overlies. The opening 186 desirably extends to portions of the surface 152 including the contacts 156, and may have dimensions that extend in the directions L1 and L2 co-extensive with the dimensions of the opening 124A. The attachment layer 180 may also extend along portions of the surface 114 of the substrate 112 uncovered by the chips 150, as shown in FIG. 4A. In an alternative embodiment, the attachment layer 180 may be disposed only between the surface 152 of the chips 150, such as the chip 150A, and the surface 114 of the substrate 112, as shown in FIG. 4B.

At the stage of manufacture of the assembly 100 shown in FIG. 2, the surface 152 of the chip 150A, the substrate 112 and the attachment layer 180, in combination, define a bond channel window 195 formed from the openings 124A and 186, including the portions 125 and 185, and the window 195 is in fluid communication with an environment at the surface 114 side or top side of the substrate 112 only at the portions 125 and 188. In other words, the bond channel window 195 is in fluid communication with the environment at top side of the substrate 112 only through the portions 188 and 125.

Referring again to FIG. 2, the opening 124B may be defined by opposite inner edges 144B' and 144B" of the substrate 112 that are spaced from each other in the direction L2, and the chip 150B overlies the entirety of the opening 124B except for portions 165A and 165B of the opening 124B that extend beyond the edges 162 and 166 of the chip 150B in the direction opposite to L2 and in the direction L2, respectively. In addition, the attachment layer 180 may define a second opening 187 extending from the surface 184 to the surface 186 and to portions of the surface 152 of the chip 150B including the contacts 156, and having dimensions that extend coextensive with the dimensions of the opening 124B. The opening 187, thus, may extend from, and be in fluid communication with, the opening 124B along its length in the direction L2, including the portions 165A and 165B. At the stage of manufacture of the assembly 100 shown in FIG. 2, the surface 152 of the chip 150B, the substrate 114 and the attachment layer 180, in combination, define a bond channel window 197 formed from the openings 124B and 187, including the portions 165A and 165B, which is in fluid communication with the environment at the top side of the substrate 112 only at the portions 165A and 165B. In other words, the bond channel window 197 is in fluid communication with the environment on the top side of the substrate only at the portions 165 extending beyond the opposite edges 162 and 164 of the chip 150B along the direction L2. The openings 187 and 124B may have a dimension extending in the direction L2 having the same length CH(B), which exceeds the length D2. In one embodiment, the portion of the attachment layer 180 defining the opening 187, and hence partially defining the window 197, may be disposed only between the chips 150B and the substrate 112, similarly as shown in FIG. 4B for the chip 150A.

Further, the assembly 100 may include wire leads 190 joining the contacts 156 at the surface 152 of the chips 150 with pads 122 on the surface 116 of the substrate 114. For example, referring to FIG. 3, for a chip 150A, the wire lead 190 may extend from the contact 156, through the opening 186 and the opening 124A that the chip overlies, to a pad 122 on the surface 116. Wire leads similarly may extend from contacts 156 of the chips 150B, through the openings 187 and 124B forming the respective windows 197 that the chips 150B overlie, to pads 122 on the surface 116.

Figure 5:
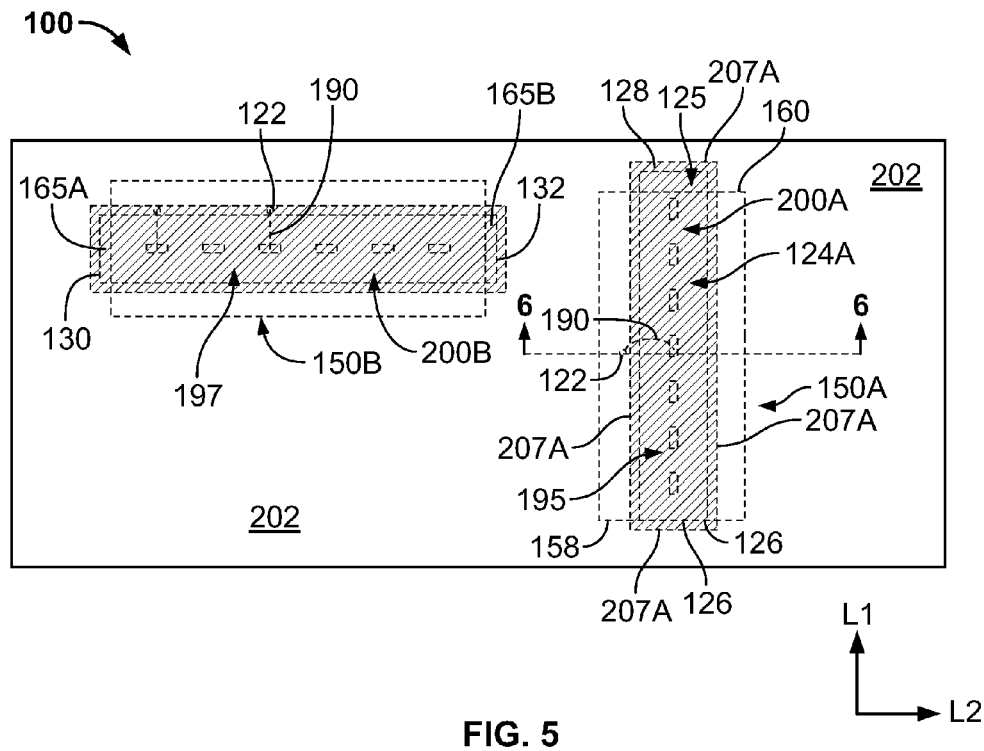
FIG. 5 is a top plan view of the microelectronic assembly of FIG. 2 at a later stage in manufacturing operations, according to an embodiment of the disclosure.
Figure 6:
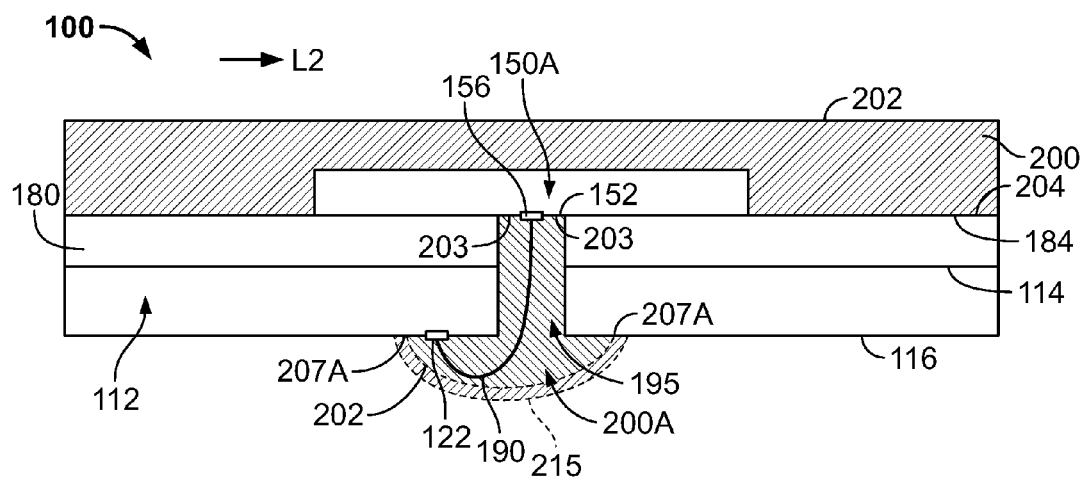
FIG. 6 is a diagrammatic sectional view of the assembly of FIG. 5 at cross-sectional line 6-6.

In a further stage of manufacture of the assembly 100 having an in-process structure as shown in FIG. 2, referring to FIGS. 5 and 6 an encapsulant 200 including dielectric material may be formed overlying the chips 150, uncovered portions of the surface 184 of the attachment layer 180 and uncovered portions of the surface 116, and also in the bond channel windows 195 and 197. In some embodiments, the encapsulant 200 may contact the peripheral edges of the chips 150, and include encapsulation portions 200A and 200B extending through the respective bond channel windows 195 and 197 that encapsulate portions of the surface 152 including contacts 156 that overlie the respective bond channel windows, the wire leads 190, the pads 122 at the surface 116 joined with the wire leads 190, and portions of the surface 116 extending from the bond channel windows. For ease of description and illustrating the encapsulant portions 200A and 200B, encapsulant material on the surface 184 is not shown in FIG. 5, which is a plan view of the top side of the substrate.

In some embodiments, the encapsulant portion extends along the entirety of the elongated dimension of the bond channel windows. For example, the portion 200A may extend in the window 195 from the end 126 to the end 128 of the opening 124A, which correspond respectively to the opposite ends of the window 195 in the direction L1. In some embodiments, the encapsulation portion occupies the entirety of the bond channel window, for example, all empty space of each of the openings 124A and 186 that form the window 195.

In an embodiment of a method of manufacture of the assembly 100, the encapsulant 200 may be formed by flowing encapsulant material, such as compound EME-X81126 or like dielectric material, at a temperature of 175° C. and pressure of 6.9 MPa, from a molding tool (not shown) in the direction L2 towards the chips 150A and 150B of the assembly 100 arranged as shown in FIG. 2, over the top side of the substrate 112, such as along the surface 184 of the attachment layer 180 (see FIG. 4A). At the chip 150A, the flowing encapsulant material may flow into the bond window 195 from the portions 188 and 125, and then continue to flow along the length of the window 195 from the edge 160 in the direction opposite to L1 towards the end 126 of the window 195. A molding element 215 (see FIG. 6, shown in phantom) may be positioned on the surface 116 or bottom side of the substrate 112 overlying the window 195, to enclose the window 195 at the bottom side of the substrate, and have a configuration such that a surface 202 of the encapsulant portion 200A is formed remote from a surface 203 of the portion 200A contacting the surface 152 of the chip 150A. The surface 202 may extend to portions of the surface 116 on either side of the bond channel window 195 in the direction L2 and also in the direction L1, depending on the configuration of the molding element 215 and its positioning upon the surface 116, to define an outer perimeter 207A of the encapsulation portion 200A at the surface 116.

Further, at the chip 150B, the encapsulant material, flowing towards the chip in the direction L2, flows through the bond channel 197 from the portion 165A, then along the length of the channel 197 in the direction L2 and out of the bond channel 197 at the portion 165B, to form the encapsulation portion 200B. The molding element 215 may be positioned at the bottom side of the substrate 112 during formation of the encapsulant 200, similarly as discussed for the chip 150A, to form a surface 202 of the encapsulant portion 200B remote from a surface 203 thereof contacting the surface 152 of the chip 150B. The encapsulation portion 200B may extend to the surface 116 on either side of the bond channel window 197 in the direction L2 and also in the direction L1, depending on the configuration and positioning at the surface 116 of the molding element 215.

Figure 1:
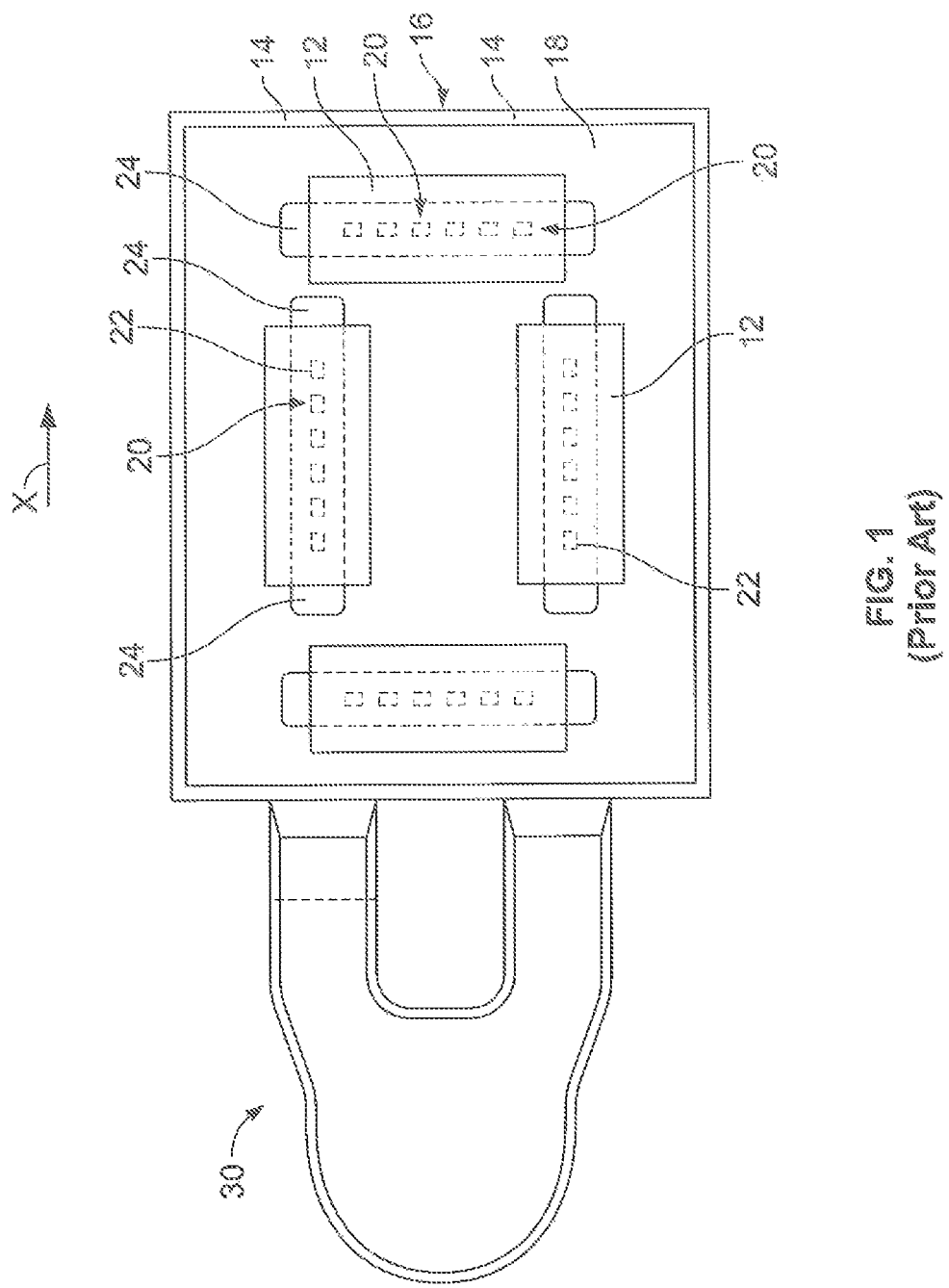
FIG. 1 is a plan view of a prior art microelectronic assembly during a stage in manufacturing operations thereof.

Accordingly, based on the construction of the window 195, the encapsulation material, flowing in the direction L2 toward the chip 150A, may flow into the window 195 only at the portions 125 and 188, and material flow therefrom away from the edge 160 of the chip is in the direction opposite to L1 and through a portion of the window 195 which is not in fluid communication with the environment at the top side of the substrate, and which may be enclosed at the bottom side by the molding element 215 so as not to be in fluid communication with the environment at the bottom side of the substrate. Encapsulation material flow from the top side of the substrate into the window 195 in the direction L1 cannot occur. The configuration of the window 195, thus, advantageously provides that, during flow of encapsulation material toward the chip 150A in a direction transverse, such as orthogonal, to the elongated dimension of the window 195, the encapsulant material can flow into the window 195 only at the end 128 thereof, in other words, flow from either end of the elongated opening as in the prior art (see FIG. 1) cannot occur, such that flow through the window 195 from the end 128 is only in a single direction, which may avoid formation of air pockets or voids in the window 195. In one embodiment, the dielectric material may be flowed over the top side of the substrate for ten seconds, after which the material may be cured for 90 seconds to form the encapsulant 200.

In another aspect, a microelectronic assembly may include chips 150B overlying bond channel windows 197, similarly as described for the assembly 100, chips 150A, having a configuration similar to that described above for the assembly 100, overlying respective bond channel windows extending elongated in a transverse direction to the windows 197, and an outlet or vent extending from and in fluid communication with the windows that the chips 150A overlie. As discussed below, the vents may be configured to permit air within the window to exit the window into the vent when encapsulant material is flowed through the window to form an encapsulant portion in the window. The vent may be partially defined by a structure that overlies a surface of the substrate and a portion of such surface of the substrate.

Figure 7:
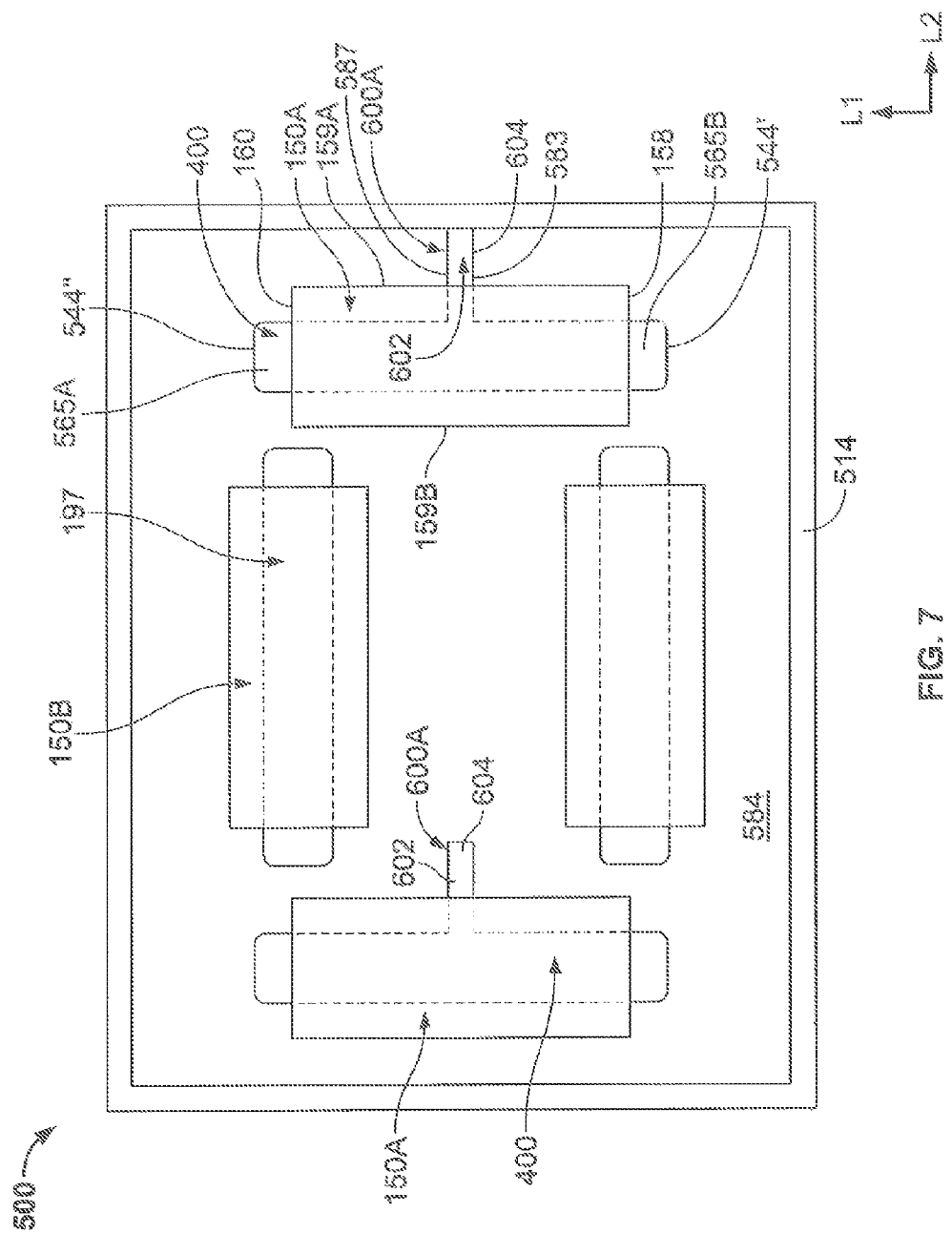
FIG. 7 is a top plan view of a microelectronic assembly at a stage in manufacturing operations, according to an embodiment of the disclosure.
Figure 8:
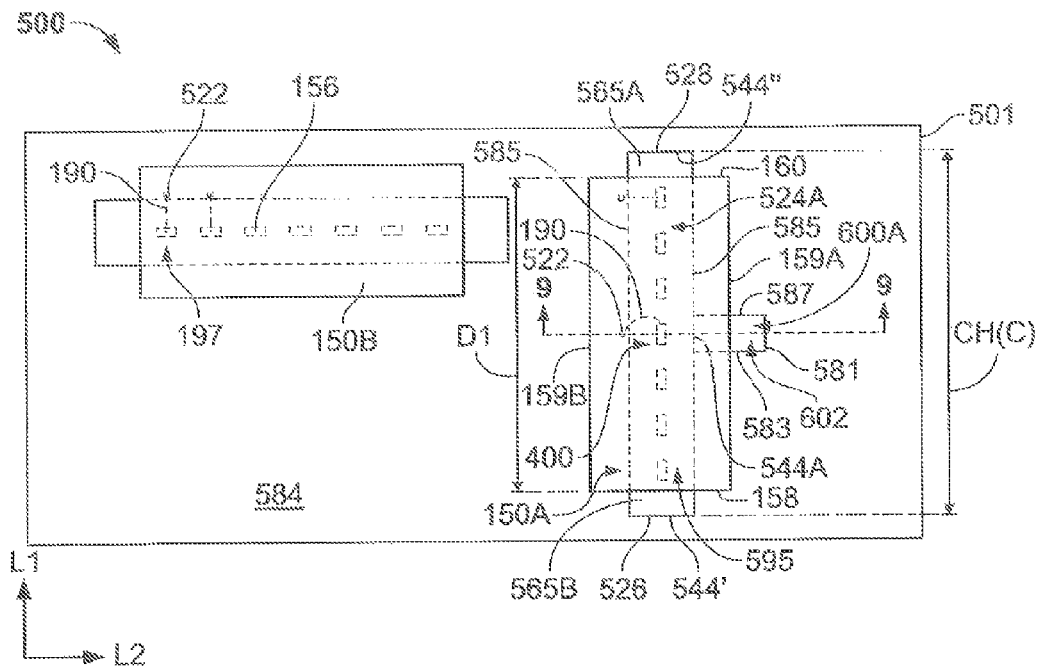
FIG. 8 is a top plan view of a portion of the microelectronic assembly of FIG. 7.
Figure 9:
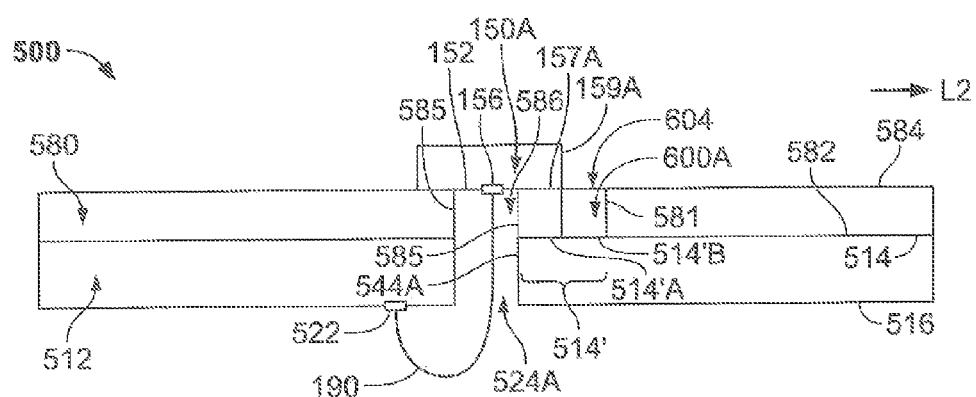
FIG. 9 is a diagrammatic sectional view of the assembly as shown in FIG. 8 at cross-sectional line 9-9.

In one embodiment of a microelectronic assembly including a vent according to the disclosure, referring to FIGS. 7-9, a microelectronic assembly 500 may include chips 150B overlying bond channel windows 197 formed by a surface 514 and an attachment layer 580 and extending elongated in a direction L2, similarly as described for the assembly 100. In addition, the assembly 500 may include the chips 150A overlying respective bond channel windows 400 formed by the surface 514 and the attachment layer 580 and extending elongated in a direction L1. Further, the assembly 500 may include, at each window 400, a vent 600A extending from and in fluid communication with the window 400, and partially defined by the substrate 512. The vent 600A extends beyond a peripheral edge 159 of the chip 150A, which extends between the edges 158 and 160, to a portion 602 of the vent 600A at which the vent 600A is in fluid communication with an environment at a top side of the substrate 512 during a stage of manufacture of the assembly 500. The portion 602 of the vent 600A, hence, may provide that the window 400 is in fluid communication with the environment at the top side of the substrate through the vent 600A during manufacturing operations of the assembly 500, which may avoid entrapment of air in the window 400 when encapsulant is provided to form an encapsulant portion in the 400 window as described in detail below.

Referring to FIGS. 8 and 9, in one embodiment the assembly 500 may include the substrate 512 defining an opening 524A that extends from a first surface 514 to an opposite second surface 516 of the substrate 512 and has an elongated dimension extending a length CH(C) in a direction L1 from a first end 526 to an opposite second end 528 of the opening 524A. The opening 524A is defined by opposite inner edge surfaces 544' and 544" of the substrate 512 at the ends 526 and 528, respectively, that are spaced from each other the length CH(C) in the direction L1. The chip 150A overlies the opening 524A except for portions 565A and 565B of the opening 524A that extend beyond the edges 158 and 160 of the chip 150A in the direction opposite to L1 and in the direction L1, respectively, to the edge surfaces 544' and 544".

In addition, the assembly 500 may include an attachment layer 580 having an inner surface 585 extending from a surface 582 to a surface 584 opposite the surface 582. The inner surface 585 defines a second opening 586 extending to portions of the surface 152 of the chip 150A including the contacts 156, and having an elongated dimension extending in the direction L1 coextensive with the elongated dimension of the opening 524A. The opening 586 desirably extends from, and is in fluid communication with, the opening 524A, including the portions 565A and 565B. In one embodiment, the opening 586 has dimensions in the directions L1 and L2 coextensive with respective dimensions of the opening 524A. Similar to the assembly 100, a bond channel window 595 may be formed from the openings 524A and 586, including the portions 565A and 565B that extend beyond the edges 160 and 158, respectively.

The chip 150A may include opposite peripheral edges 159A and 159B extending between the edges 158 and 160. In the illustrated embodiment, the chip 150A may have a rectangularly-shaped periphery, where the edges 158 and 160 are parallel and orthogonal to the edges 159, and overlie the substrate 512 with the edges 158, 160 extending in the direction L2 and the edges 159 extending in the direction L1, which is orthogonal to L2.

In one embodiment as shown in FIGS. 7-9, the vent 600A may be defined by a surface portion 514' of the surface 514 of the substrate 512 extending from an inner edge surface 544A of the substrate that defines the window 524A. The inner edge surface 544A is disposed between the inner edge surfaces 544' and 544" of the surface 514, and the surface portion 514' extends from the inner edge surface 544A to an inner surface 581 of the attachment layer 580. The inner surface 581 extends from the surface 582 to the surface 584, and from an inner surface 583 to an inner surface 587 of the attachment layer 560 which is opposite the surface 583. The inner surfaces 583 and 587 extend from the surface 582 to the surface 584 of the attachment layer, and also in the direction L2 from the surface 585 to the surface 581. In addition, the surface portion 514' extends from the surface 583 to the surface 587 of the attachment layer 580. Further, a portion 157A of the surface 152 of the chip 150A overlies a surface portion 514'A of the surface portion 514' to define, in combination with the surface 584 of the attachment layer 580, an interface 604 of the portion 602 of the vent 600A which overlies a surface portion 514'B of the surface 514'. The surface portions 514'A and 514'B, which are distinct surface portions, together form the surface portion 514'. The interface 604 extends in the direction L2 from the surface 157A at the edge 159A of the chip 150A to the portions of the surface 584 from which the surfaces 581, 583 and 587 extend toward the surface 582.

In one embodiment, the interface 604 may have surface area of about at least 10,000 square micrometers. In addition, the vent portion 602 may have a dimension extending in the direction L1 from the edge 583 to the edge 587 of between about 200 and 300 micrometers, and a dimension extending beyond the edge 159 in the direction L2 of at least about 50 to 300 micrometers. In addition, the vent 600A, at the surface 585, may have a dimension extending in the direction L1 from the edge surface 583 to the edge surface 587 of between about 200 and 300 micrometers. In another embodiment, the vent 600A may extend from the window 400 to a peripheral edge 501 of the assembly 500.

At this stage of manufacture of the assembly 500 (FIG. 8), the surface 152 of the chip 150A, the surface 544 of the substrate 512 and the surface 585 of the attachment layer 580, in combination, define a bond channel window 595 formed from the openings 524A and 586, including the portions 565A and 565B, which is in fluid communication with an environment at the top side of the substrate 512 at the portions 565A and 565B through the vent 600A. The vent 600A is defined by the surfaces 581, 583 and 587 of the attachment layer 580, the surface portion 514' of the substrate and the surface portion 157A of the chip 152A. The bond channel window 595 is in fluid communication with the environment on the top side of the substrate at the portions 565 extending beyond the opposite edges 158 and 160 along the direction L1, and through the vent 600A, which is in fluid communication with the environment on the top side of the substrate at the interface 604 of the vent portion 602.

In one embodiment, the chip 150A may overlie the window 595 and not overlie the vent 600A, such that vent 600A is defined only by the surface 514' and an inner surface or surfaces, such as the surfaces 581, 593 and 587, of the attachment layer 580.

Similar to the assembly 100, wire leads 190 may extend from the surface 152 of the chip 150A, through the opening 586 and the opening 524A, to traces 522 on the surface 516. Also, wire leads 190 may extend from contacts of the chips 150B through the openings forming the bond channel window 197 to traces on the surface 516, similar as in the assembly 100.

Figure 10:
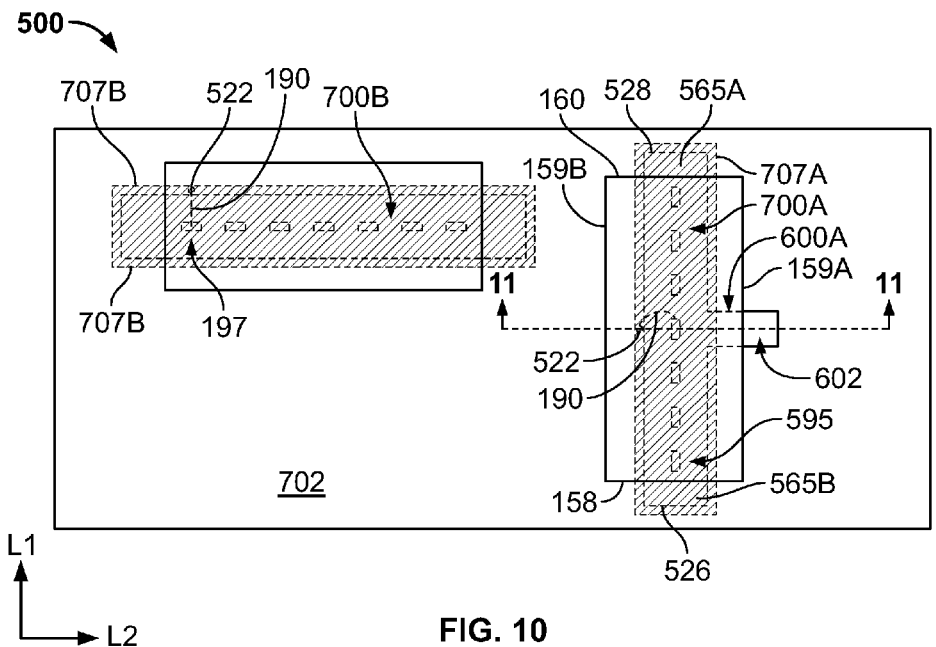
FIG. 10 is a top plan view of the portion of the microelectronic assembly as shown in FIG. 8 at a later stage in manufacturing operations, according to an embodiment of the disclosure.
Figure 11:
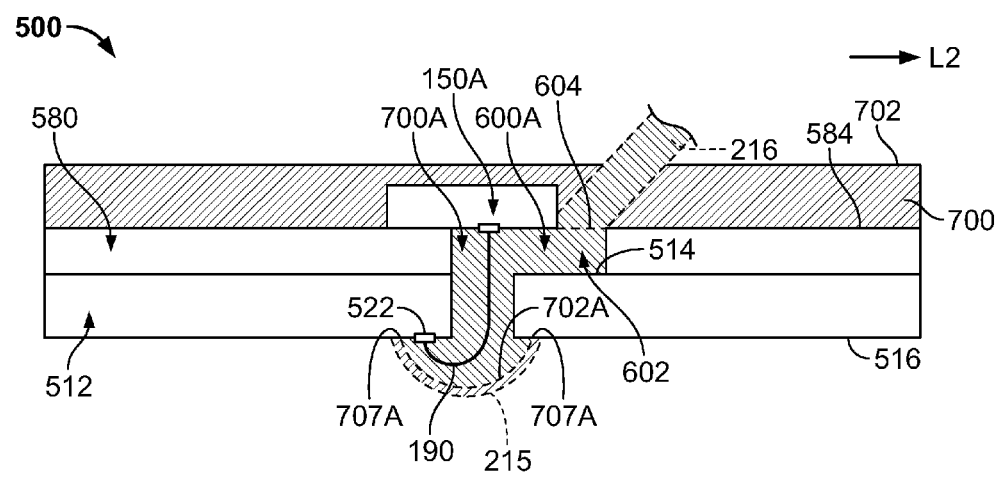
FIG. 11 is a diagrammatic sectional view of the microelectronic assembly as shown in FIG. 10 at cross-sectional line 11-11.

In a further stage of manufacture of the assembly 500 having an in-process structure as shown in FIGS. 7-9, an encapsulant 700 including dielectric material may be formed overlying the chips 150, uncovered portions of the surface 584 of the attachment layer 580 and uncovered portions of the surface 514 and the surface 516; and in the bond channel windows 197 and 595 and, optionally, in the vents 600A, as shown in FIGS. 10-11. For ease of description and illustrating encapsulant portions 700A and 700B in the bond channel windows 197 and 595, encapsulant material on the surface 584 is not shown in FIG. 10.

In some embodiments, the encapsulant 700 may include an encapsulation portion 700B, configured similar to the portion 200B in the assembly 100, extending through the bond channel window 197 to encapsulate portions of the surface 152 including contacts 156, the wire leads 190, traces 522 at the surface 516 joined with the wire leads, and portions of the surface 516 extending from the bond channel window 197 to a perimeter edge 707B of a surface 702B of the portion 700B remote from the chip 150B.

In addition, the encapsulant 700 may include an encapsulation portion 700A extending through the bond channel window 595, to encapsulate portions of the surface 152 including contacts 156, the wire leads 190 and traces 522 at the surface 516 joined with the wire leads. In addition, the encapsulation portion 700A may overlie uncovered portions of the surface 516 extending from the window 595 to uncovered portions of the surface 516 and include a surface 702A remote from the chip 150A. The surface 702A may extend to portions of the surface 516 on either side of the bond channel window 195 in the direction L2 and also in the direction L1 to define an outer perimeter 707A of the encapsulation portion 700A at the surface 516.

In addition, the encapsulant portion 700A may extend into the vent 600A and to the interface 604 of the vent portion 602, and in some embodiment fill the entirety of the vent 600A.

In an embodiment, the encapsulant 700 may be formed by flowing encapsulant material from a molding tool (not shown) in the direction L2 towards the chips 150A and 150B, such as arranged as shown in FIGS. 7 and 9, over the top side of the substrate 512, such as along the surface 584 of the attachment layer 580. At the chip 150B, the encapsulant material flows through the bond channel 197, similarly as described above for the assembly 100, and a molding element may be positioned against the surface 516 of the substrate 112 to form the surface 702 of the encapsulant portion 700B. In addition, referring to FIGS. 10-11, at the chip 150A the encapsulant material may flow through the bond channel window 595, from the portion 565A in the direction opposite to L1 and the portion 565B in the direction L1, to portions of the window 595 that the chip 150A overlies. The flow of the encpasulant material from the opposite ends 526 and 528 of the opening 524A towards each other along the elongated dimension of the window 595 may cause air to be forced from the window 595 into the vent 600A, which desirably is a predetermined distance in the direction L1 from an end 526 or 528 of the window 595 that is a percentage of the length CH(C). In one embodiment, the vent 600A is a distance equal to about 40-60% of the length CH(C) from either of the ends 528 and 526 of the window 595, so as to provide that when encapsulant is flowed to form the portion 700A air may exit from the window 595 at the vent 600A to avoid voids being formed in the window 595.

In one embodiment, the encapsulant portion 700A may extend into the vent 600A from the window 595 and also from the interface 604 of the portion 602. In some embodiments, the encapsulant portion 700A may occupy the entirety of the window 595 and also the vent 600A. The arrangement of the window 595 with the vent 600A extending therefrom advantageously may permit encapsulant material flowing in a transverse, such as orthogonal, direction to the elongated direction in which the window 595 extends, to enter into the channel 595 from both ends 526 and 528 and flow from the ends 526 and 528 toward a portion of the window from which the vent 600A extends so as to force any air in the window 595 into the vent 600A, thereby avoiding air pockets or voids from being formed in the channel 595 during flow of encapsulant material to form the encapsulation portion 700A.

In one embodiment, during flow of the encapsulant material to form the encapsulant, a vacuum device 216 (shown in phantom in FIG. 11) that applies a vacuum may be positioned at the top side of the substrate near or at the interface 604. During flowing of encapsulant material to form the encapsulant portion 700A, the vacuum device 216 may be operated to apply a vacuum at the interface 604 to evacuate air from the window 595, through the vent 600A and the interface 604, and into the vacuum device, which may avoid entrapment of air in the window 595 during formation of the encapsulant portion 700A. The interface 604 of the vent portion 602 desirably has dimensions that avoid encapsulant material that is flowing along the top side of the substrate from entering into the vent portion 602 through the interface 604.

Figure 12:
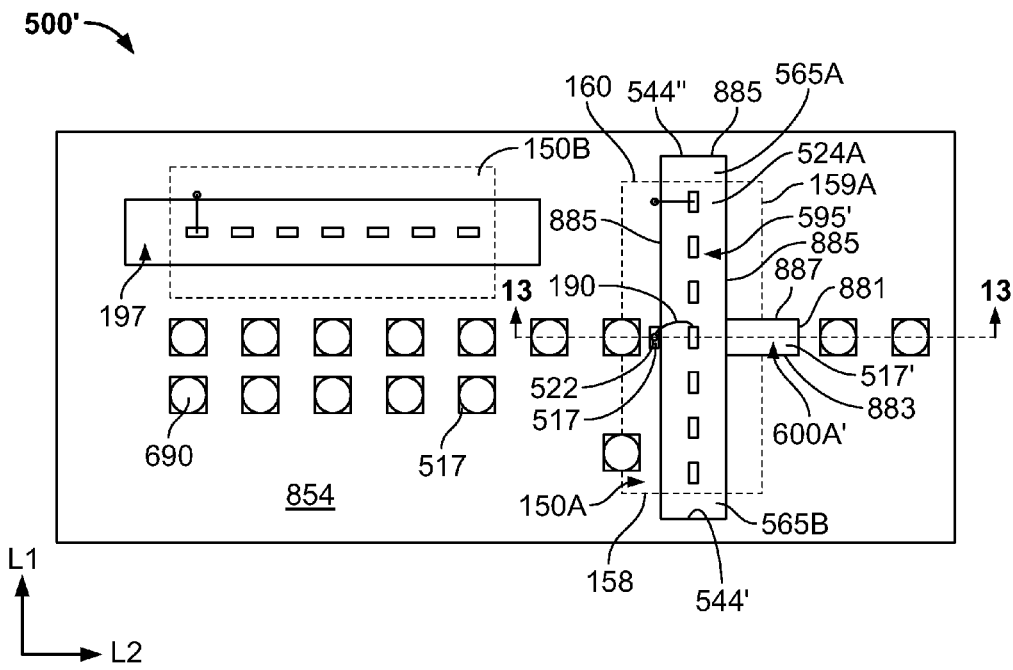
FIG. 12 is a bottom plan view of a portion of a microelectronic assembly at a stage in manufacturing operations, according to an embodiment of the disclosure.
Figure 13:
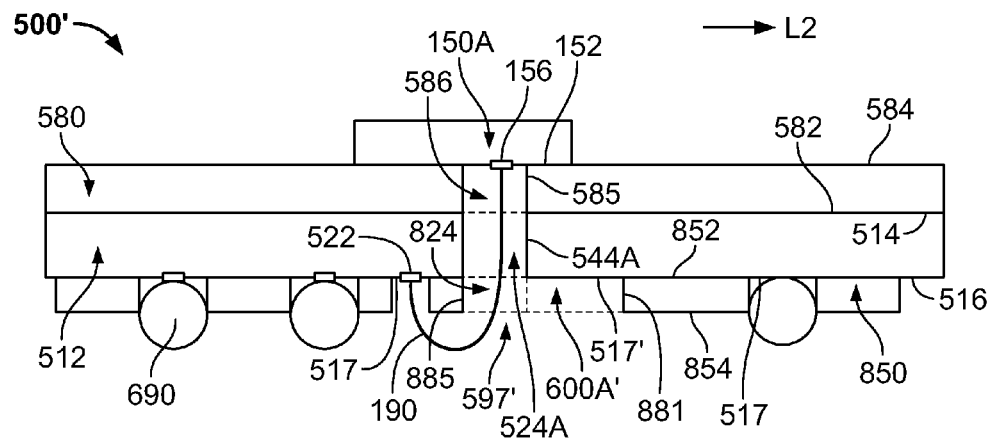
FIG. 13 is a diagrammatic sectional view of the microelectronic assembly as shown in FIG. 12 at cross-sectional line 13-13.

In another embodiment, referring to FIGS. 12 and 13, a microelectronic assembly 500' may include chips 150B overlying bond channel windows 197, similarly as described above for the assembly 500. In addition, the assembly 500' may include chips 150A, having a configuration similar to that described above for the assembly 500, overlying respective bond channel windows 595' defined by the substrate 512, the attachment layer 580 overlying the surface 514 of the substrate 512 and a photoimageable layer 850 overlying the surface 516 of the substrate 512, where the window 595' extends elongated in the direction L1. Further, the assembly 500' may include, at each window 595', a vent 600A' defined by the substrate 512 and the layer 850 and extending from the window 595', and which is in fluid communication with an environment at the surface 516 of the substrate 512 during a stage of manufacture of the assembly 500'. In one embodiment, the vent 600A' may extend from the window 595' beyond a peripheral edge of the chip 150A, such as the edge 159A of the overlying chip 150A.

In the illustrated embodiment, the chip 150A overlies the attachment layer 580 and the attachment layer 580 forms the opening 586 having dimensions in the directions L1 and L2 co-extensive with respective dimensions of the opening 524A, as in the assembly 500. In addition, the photoimageable layer 850, such as a solder mask layer, may be formed on portions of the surface 516 to uncover surface portions 517 of the surface 516 and traces 522 on the surface 516. The layer 850 extends from a surface 852 extending along the surface 516 to a surface 854 opposite the surface 854. The layer 850 may include an inner surface 885, which extends from the surface 852 to the surface 854 and defines an opening 824. The opening 824 may extend from, and be in fluid communication with, the opening 524A along the elongated dimension extending in the direction L1. In one embodiment, the opening 824 has dimensions extending in the directions L1 and L2 co-extensive with respectively corresponding dimensions of the opening 524A. The combination of the openings 524A, 586 and 824 form a bond channel window 595'.

The uncovered surface portions 517 may be configured by the layer 850 so that solder elements 690, such as solder balls, may be formed at the portions 517 in a pattern as a solder ball grid array, using conventional techniques.

In addition, an uncovered surface portion 517' of the surface 516 may extend in the direction L2 from the inner edge 544A of the substrate 516 that defines the window 524A. The surface portion 517' extends from the inner edge 544A to an inner surface 881 of the layer 850, which extends from the surface 582 to the surface 584, and from an inner surface 883 to an inner surface 887 of the layer 850 opposite the surface 883. The inner surfaces 883 and 887 extend from the surface 852 to the surface 854 of the layer 850, and also from the surface 885 to the surface 881 in the direction L2. In addition, the surface portion 517' extends from the surface 883 to the surface 887 of the layer 858. The surface portion 517', in combination with the surfaces 881, 883 and 886 of the layer 850, defines a vent 600A' at the bottom side of the substrate 512.

In one embodiment, the surface area of the portion 517', which is uncovered at the bottom side of the substrate 512, may be about 50,000 square micrometers, and may have a dimension extending in the direction L1 from the surface 883 to the surface 887 of about 100 micrometers, and a dimension extending from the surface 885 to the surface 881 in the direction L2 of at least about 500 micrometers. In other embodiments, the portion 517' may extend to a peripheral edge 501' of the assembly 500'.

At this stage of manufacture of the assembly 500', the bond channel window 595' is in fluid communication with an environment at the top side of the surface 514 at the portions 565A and 565B. In addition, the vent 600A' is in fluid communication with the bond channel window 595'. Also, the vent 600A' and a portion 597' of the window 595' remote from and opposite the chip 150A are in fluid communication with the environment at the bottom side of the substrate 512.

In one embodiment, the chip 150A may overlie the window 595' and not overlie the vent 600A'. Wire leads 190 may extend from the contacts 156 at the surface 152 of the chip 150A, through the opening 586, the opening 524A and the opening 824, to traces 522 on the surface 516.

Figure 14:
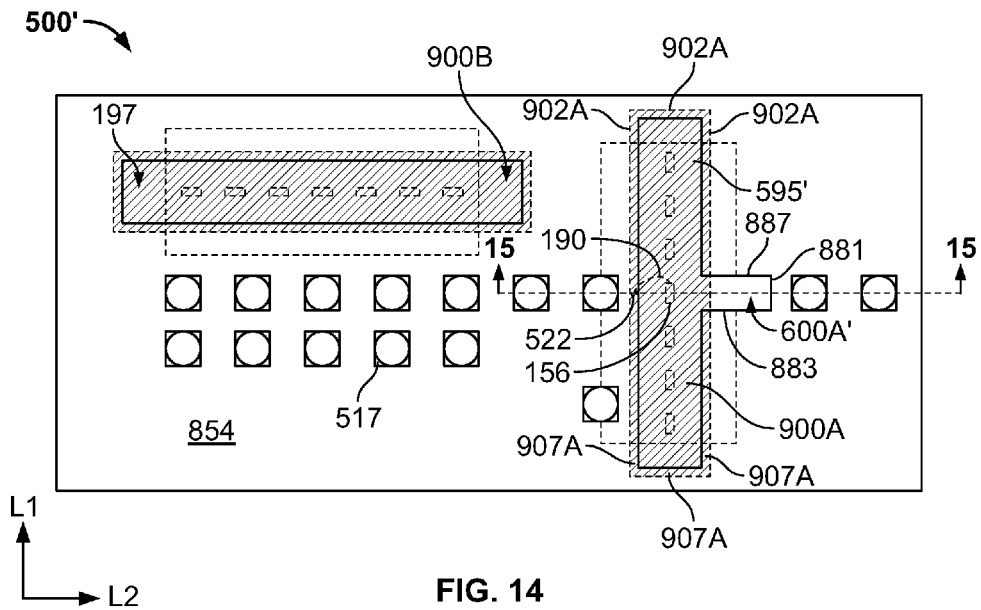
FIG. 14 is a bottom plan view of the microelectronic assembly as shown in FIG. 12 at a later stage in manufacturing operations, according to an embodiment of the disclosure.
Figure 15:
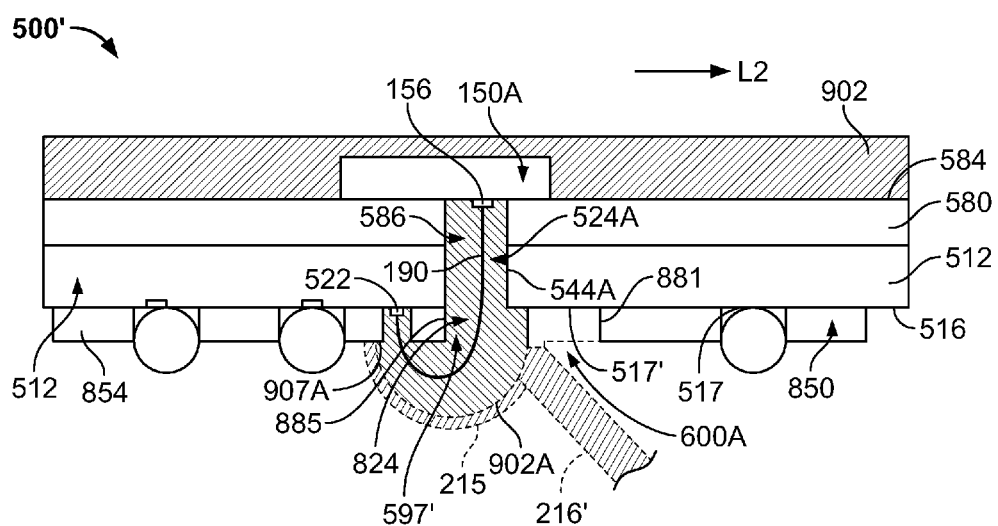
FIG. 15 is a diagrammatic sectional view of the microelectronic assembly as shown in FIG. 14 at cross-sectional line 15-15.

In a further stage of manufacture of the assembly 500' having an in-process structure as shown in FIGS. 12-13, an encapsulant 900 including dielectric material may be formed (see FIGS. 14-15) overlying the chips 150, uncovered portions of the surface 584 of the attachment layer 580, uncovered portions of the surface 516 and uncovered portions of the surface 854 extending from the window 595'; and in the bond channel windows 197 and 595' and, optionally, in the vents 600A'. The encapsulant 900 includes encapsulant portions 900B in the bond channel windows 197, similar to the encapsulant portions 700B in the windows 197 as in the assembly 500.

In addition, the encapsulant 900 may include an encapsulation portion 900A, extending through the bond channel window 595', to encapsulate portions of the surface 152 including contacts 156, the wire leads 190 and the traces 522 at the surface 517 joined with the wire leads. In addition, the encapsulation portion 900A may overlie uncovered portions of the surface 854 extending from the bond channel window 595' and include a surface 902A remote from the chip 150A extending from the uncovered portions of the surface 854 adjacent the window portion 597'. The surface 902A may extend to portions of the surface 854 on either side of the bond channel window 595' in the directions L2 and L1 to define an outer perimeter 907A of the encapsulation portion 900A at the surface 854.

In addition, the encapsulant portion 900A may extend into the vent 600A' and to the surface 881 of the layer 850 and the surface portion 517', and in some embodiments fill the entirety of the vent 600A'.

In an embodiment, the encapsulant 900 may be formed by flowing encapsulant material from a molding tool (not shown) in the direction L2 towards the chips 150A and 150B, such as arranged as shown in FIG. 12, over the top side of the substrate 512, similarly as described above for the assembly 500. The encapsulant portions 900B may be formed similarly as the encapsulation portions 700B in the assembly 500. In addition, at the chip 150A, the encapsulant material may flow through the bond channel window 595', from the portions 565A and 565B similarly as described for the assembly 500. In this embodiment, however, the flow of the encpasulant material from opposite ends of the window 595' may cause air to be forced from the window 595' into the vent 600A' at the bottom side of the substrate, such that the encapsulant portion 900A is formed in the window 595' without voids and completely encapsulates the leads 190 and contacts at the surface 152 of the chip.

In some embodiments, the encapsulant 900A may occupy the entirety of the window 595' and also the vent 600A'. The arrangement of the window 595' with the vent 600A' extending therefrom advantageously may permit encapsulant material flowing in a transverse, such as orthogonal, direction to the direction that the window 595' extends elongated, to enter into the channel 595' from opposite ends of the elongated dimension and then flow toward a portion of the window from which the vent extends and force air in the window 595' into the vent 600A', thereby avoiding air pockets or voids from being formed in the channel 595' during flow of encapsulant material.

In one embodiment, when the encapsulant material is flowing over the top surface of the substrate, the molding element 215 may be positioned against the bottom surface of the substrate 516 and a vacuum device 216' may be positioned at the bottom side of the substrate at the vent 600A'. The vacuum device 216' may be operated to apply a vacuum at the vent 600A' to evacuate air in the window 595' through the vent 600A' into the vacuum device 216', which may then exhaust the evacuated air to the environment.

In one embodiment, an assembly according to the disclosure may include a vent formed from a first vent, such as vent 600A, at the top side of the substrate and a second vent, such as a vent 600A', also at the bottom side of the substrate as described above for the assemblies 500 and 500', respectively. In another embodiment, the one or more vents may extend from a bond channel window, such as the window 595 or 595', beyond a peripheral edge of the chip 150A between the edges 158 and 160.

Figure 16:
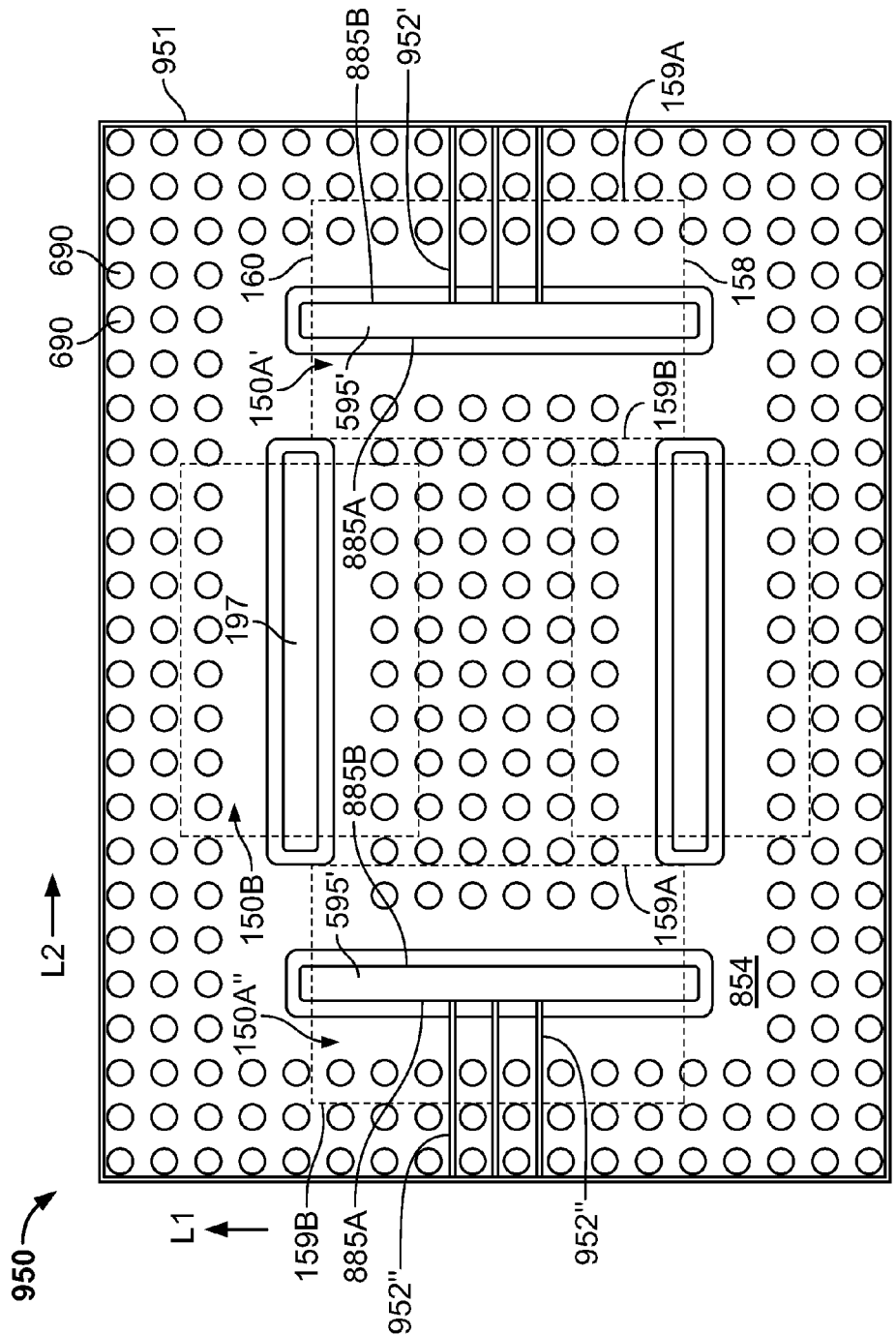
FIG. 16 is a bottom plan view of a microelectronic assembly, according to an embodiment of the disclosure.

FIG. 16 is a plan view of a bottom side of a substrate of a microelectronic assembly 950 according to another embodiment of the disclosure. Referring to FIG. 16, the microelectronic assembly 950 may include chips 150B and 150A arranged overlying bond channel windows 197 and 595', respectively, similarly as in the assembly 500' (see FIGS. 12-15), and a plurality of vents 952 formed at the bottom side of the substrate 512 and extending from the windows 595', similar to the vents 600A in the assembly 500'. In one embodiment, a chip 150A' may have opposite peripheral edges 159A and 159B that extend from the edge 158 and 160, and the layer 850 may include inner surfaces 885A and 885B that extend in the direction L1 and define the window 595'. Vents 952' may extend from the window 595' that a chip 150A' overlies, in the direction L2, beyond the peripheral edge 159A of the chip 150A to a peripheral edge 951 of the assembly 950. The layer 850 may be configured on the surface 516 of the surface 514 such that the vents 952' extend from the surface 885B in the direction L2 and between solder elements 690 that the chip 150A' may or may not overlie.

In some embodiments, the layer 850 may be configured on the surface 516 such that vents 952" extend from inner surface 885A of the layer 850 defining the window 595' that a chip 150A" overlies, in a direction opposite to L2, beyond a peripheral edge 159B of chip 150A". The vents 952 may extend from the window 595 at a position that is distance of about 40_ to 60% of the length of the window 595' in the direction L1. In such embodiment, during flow of encapsulant material in the direction L2, similarly as described above for the assembly 500', encapsulant may flow into the window 595' from opposite ends thereof, and the vents 952, which extend in the same or the opposite direction to the direction L2 that encapsulant flow towards the chips 150A, may avoid entrapment of air or formation of voids in the windows 595'.

Figure 17:
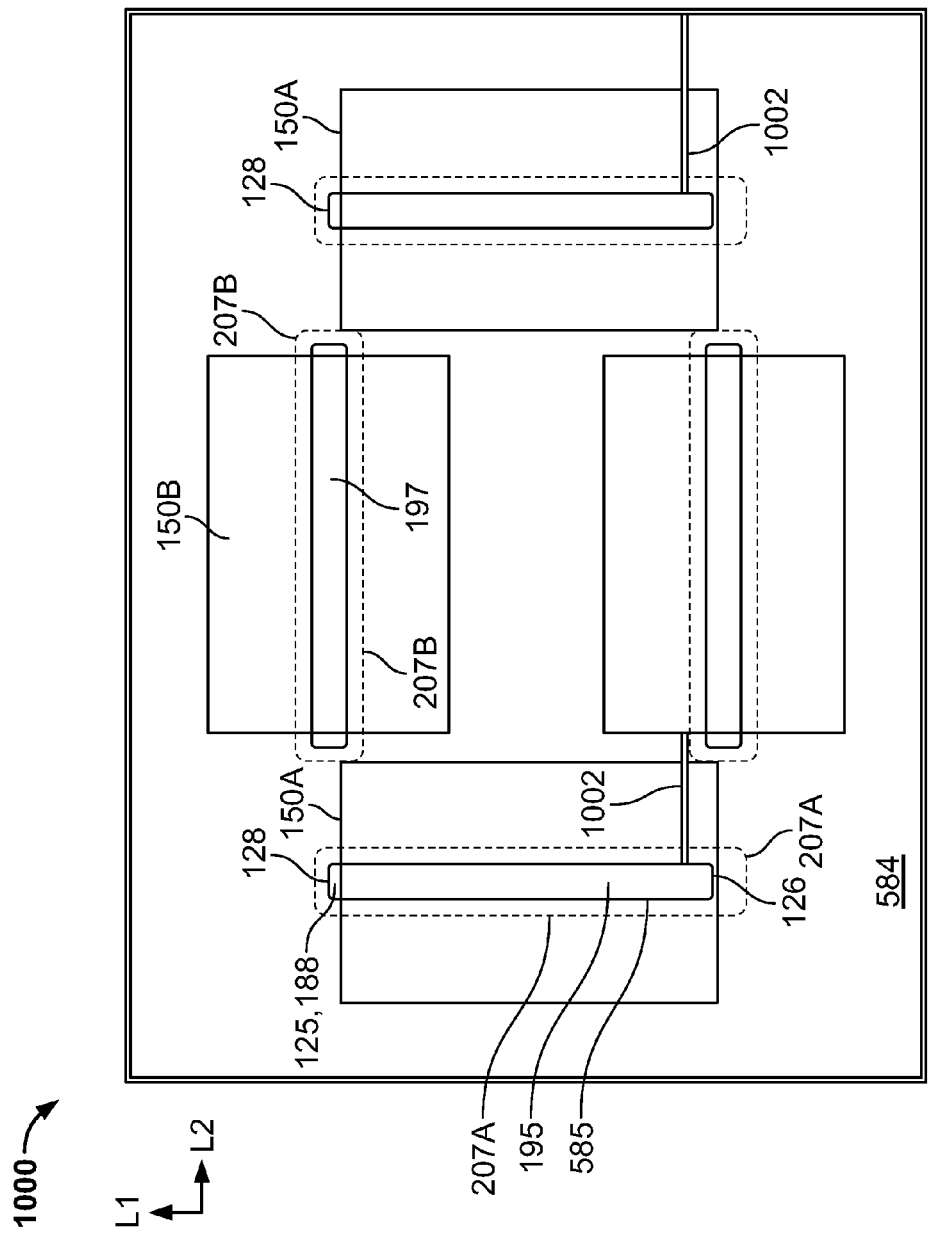
FIG. 17 is a top plan view of a microelectronic assembly, according to an embodiment of the disclosure.

FIG. 17 is a plan view of a top side of a substrate of a microelectronic assembly 1000 according to another embodiment of the disclosure. Referring to FIG. 17, the microelectronic assembly 1000 may include chips 150A and 150B arranged overlying bond channel windows 195 and 197, respectively, similarly as in the assembly 100 (see FIGS. 2-3), and vents 1002 may be formed at the top side of the substrate. For example, similarly as in the assembly 500 (see FIG. 8), the assembly 1000 may include an attachment layer 584 configured to define, with the surface 514 of a substrate 512 as shown in FIGS. 8-9, a vent 1002 extending in the direction L2 from the window 195 adjacent the end 126. The window 195, as in the assembly 100, is in fluid communication only at the end 128 (portions 125 and 188) with the environment at the top side of the substrate 512. The vent 1002 desirably extends in the direction L2 from the inner surface 585 of the layer 580 and is at least a distance from the end 128 of at least about 90 percent of the length of the window 195 in the direction L1. In such embodiment, during flow of encapsulant material in the direction L2, similarly as described above, encapsulant may flow into the window 195 only from the end 128 at the portions 188 and 125 (as discussed with reference to FIGS. 5 and 6) and the encapsulant flowing therefrom in the direction opposite to L1 along the elongated dimension of the window 195 towards the end 126 may force air towards and into the vent 1002 at the end 126, thereby avoiding entrapment of air or formation of voids in the window 195.

Figure 18:
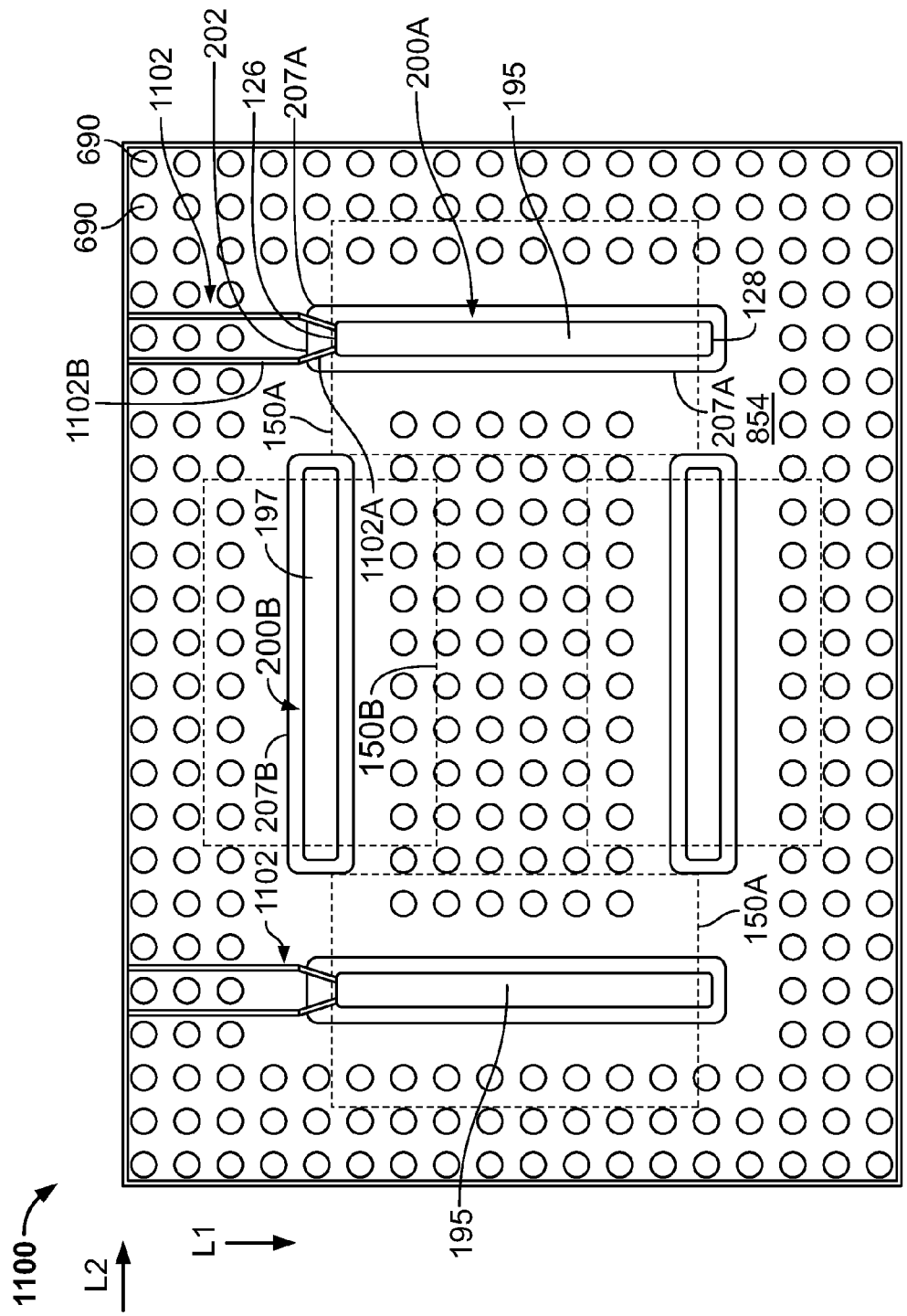
FIG. 18 is a bottom plan view of a microelectronic assembly, according to an embodiment of the disclosure.

FIG. 18 is a plan view of a bottom side of a substrate of a microelectronic assembly 1100 according to another embodiment of the disclosure. The assembly 1100 may include chips 150A and 150B arranged overlying windows 195 and 197, similar to the assembly 1000, except that the vents 1002 are omitted. In such embodiment, a photoimageable layer 850 (see FIGS. 12-13) may be formed on the surface 116 of substrate 112, similarly as on the surface 516 of the substrate 512 in the assembly 500 (see FIG. 11), and configured to define vents 1102. The vents 1102 at the bottom side of the substrate 112 extend from the windows 195, similar to the vents 600A' in the assembly 500'. The vents 1102 extend generally in the direction opposite to L1 at the end 126 of the window 195, to a peripheral edge 1101 of the assembly 1100. The layer 850 may be configured such that vents 1102 include a first portion 1102A extending at an angle relative to the direction opposite to L1, and a second portion 1102B extending from the first portions 1102A in the direction opposite to L1, where the angle of the portion 1102A is to provide that the portion 1102B extends between adjacent rows of the solder elements at the surface 116 side of the substrate 112. In such embodiment, during flow of encapsulant material in the direction L2, similarly as described above for the assembly 500', encapsulant may flow into the window 195 from the end 128 in the opposite direction to L1. The vents 1102, which extend from the end 126 in the same direction as the flow of the encapsulant toward the end 126 from the end 128, may provide that entrapment of air or formation of voids in the window 195 is avoided, because air may be forced by the flowing encapsulant into vents 1102 from the windows 195. In some embodiments, as described in above embodiment, a vacuum may be applied at the vents 1102 on the surface 116 side of the substrate 112 to evacuate air from the window 195 through the vents 1102. In one embodiment, the molding tool may be configured such that the vent portions 1102A extend through encapsulation material to the peripheral edge 207A of the encapsulation portion 200A formed in the window 195, and the vent portion 1102B extends from the surface 202 of the encapsulation element 200A.

Figure 19:
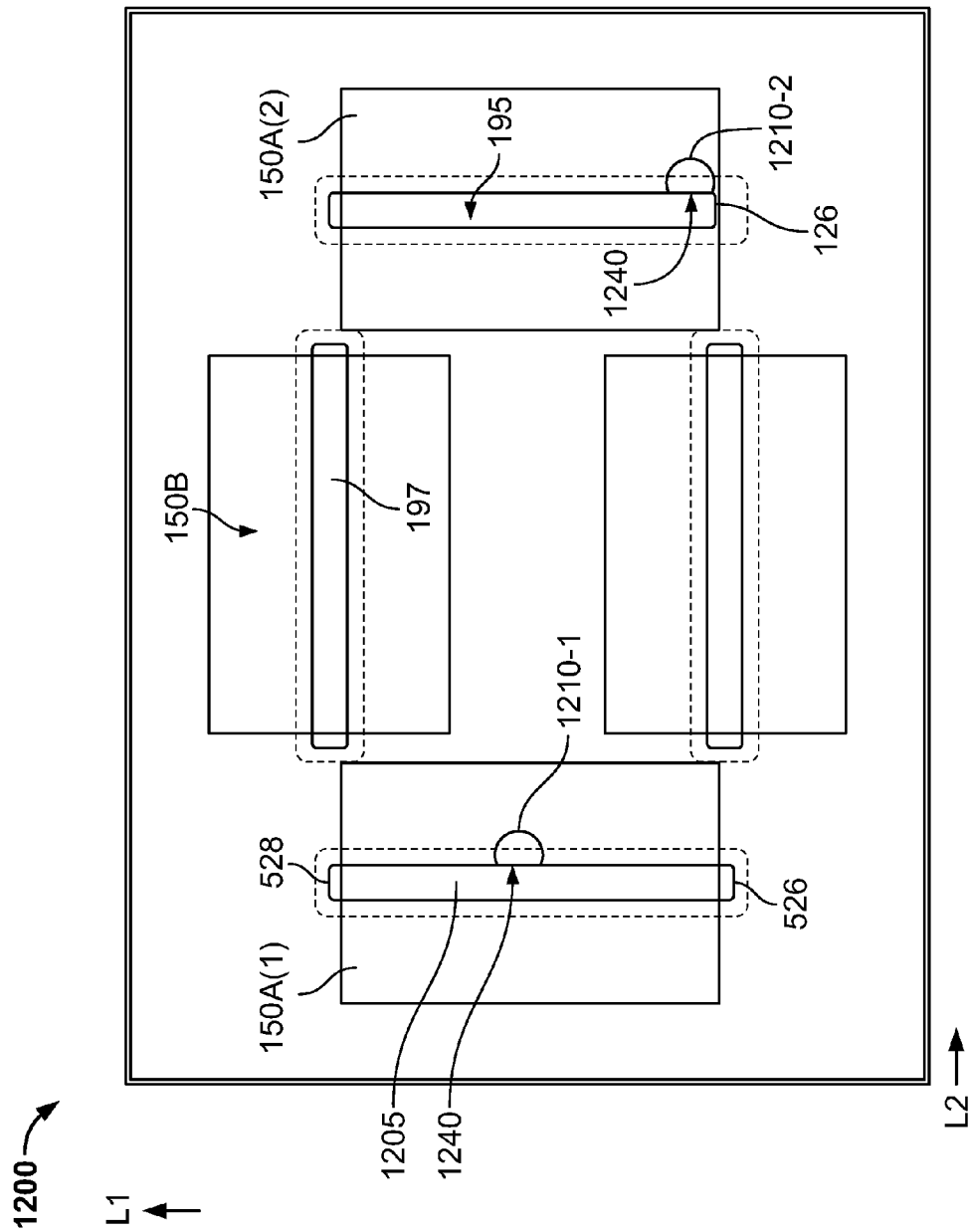
FIG. 19 is a top plan view of a microelectronic assembly, according to an embodiment of the disclosure.
Figure 20:
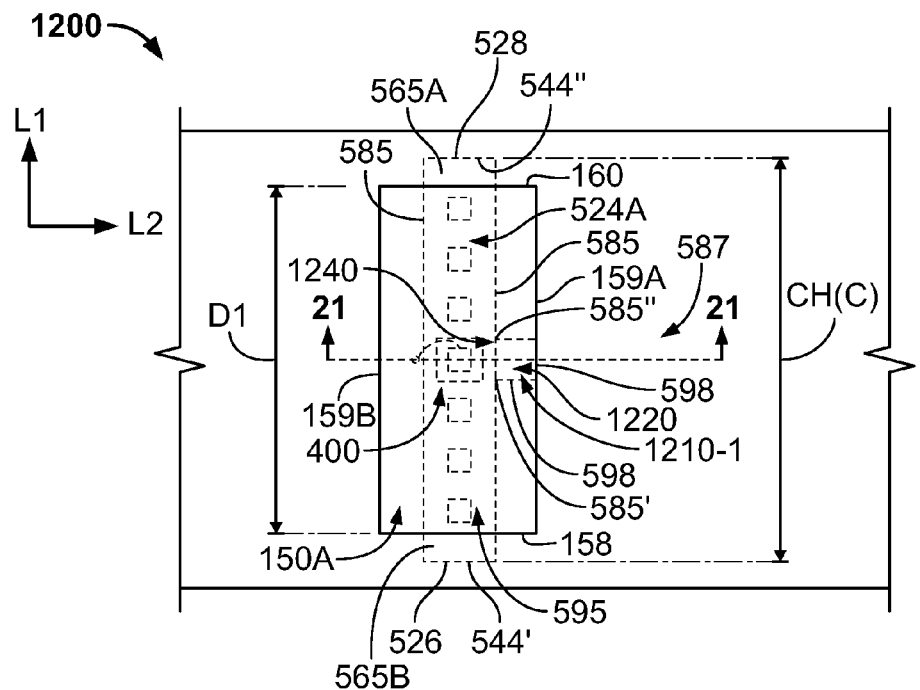
FIG. 20 is a top plan view of a portion of the microelectronic assembly of FIG. 19.
Figure 21:
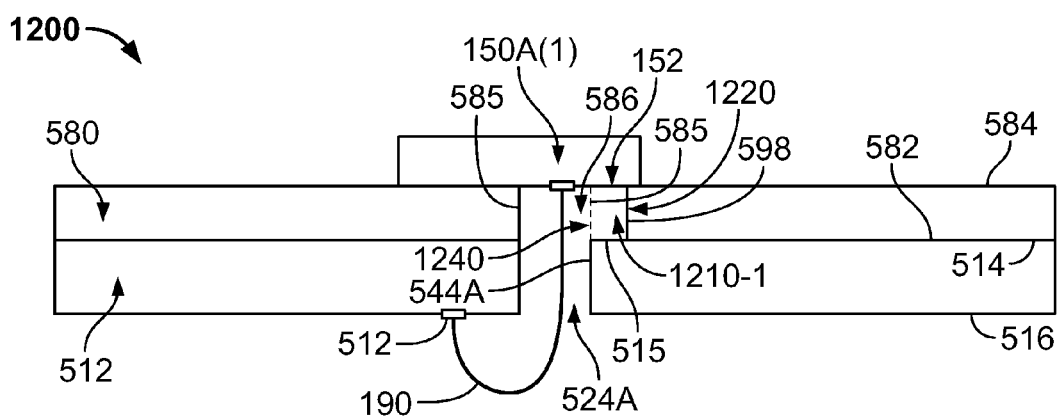
FIG. 21 is a diagrammatic sectional view of the microelectronic assembly as shown in FIG. 20 at cross-sectional line 21-21.

In another embodiment, referring to FIGS. 19-21, a microelectronic assembly 1200 may include chips 150A and 150B arranged overlying respective bond channel windows formed from openings defined by a surface 514 and an attachment layer 580, similarly as in the assemblies 100 and 500 described above, and vents 1210 extending from the bond channel windows that the chips 150A overlie. The vents 1210 may be enclosed at all portions other than an interface 1240 from which the vents 1210 extend from the windows. In other words, the vents 1210 constitute an outlet from the windows that does not serve as an exhaust pathway, such as to the environment at the top side of the surface 514, but rather the vents 1210 are volumes of completely enclosed and sealed space except for at the interface 1240 where the vent 1210 is in fluid communication with the window.

Referring to FIG. 19, chips 150B may overlie bond channel windows 197 formed similarly as shown in FIG. 10 for the assembly 500, a chip 150A(1) may overlie a bond channel window 1205 and a chip 150A(2) may overlie a bond channel window 195 formed similarly as in the assembly 100. Referring to FIGS. 20 and 21, the substrate 512 may define an opening 524A, and the attachment layer 580 may define an opening 586 having dimensions in the direction L1 and L2 co-extensive with the opening 524A, similarly as in the assembly 500. The opening 524A and opening 586, in combination, form a bond channel window 1205 extending from the end 526 to the end 528 in the direction L1.

The vent 1210-1 may be defined by an inner surface of the attachment layer 580, a portion of the surface 514 and a portion of the surface 157 of the chip 150(A)1. For example, the vent 1210-1 may defined by a portion 515 of the surface 514 of the substrate 512 extending from the inner edge surface 544A of the substrate that defines the window 524A. The surface portion 515 extends from the inner edge 544A to an inner surface 595 of the attachment layer 580. The inner surface 595 extends from the surface 582 to a portion of the surface 584 that extends along the surface 152 of the chip 150A. The inner surface 595 also may extend arcuately from an edge 585' of the surface 585 to an edge 585" of the surface 585, where the edge 585" is further from the end 526 than the edge 585'. The configuration of the inner surface 595 defines an indentation or recess 1220 in the attachment layer 580. The indentation 1220 is bounded by the surface portion 515, a portion of the surface 152A which overlies the surface portion 515 and the inner surface 595 so as to define the vent 1210-1 extending at the interface 1240 from the window 1205. In another embodiment, the attachment layer may be configured to have several inner surface portions extending from one another between the edges 585' and 585" that form the indentation 1220. In one embodiment, the vent 1210 may have a volume of at least about 2,000,000 cubic micrometers, and a dimension of about 40,000 square micrometers at the interface 1240.

In some embodiments, a plurality of vents 1210-1 may be formed along the elongated length of the window 1205 and be spaced from the ends 526 and 528 similarly as the vents 600A, on either side of the window in the direction L2.

In addition, a vent 1210-2 extending from the window 195, having a configuration similar to the vent 1210-1, may be defined by the attachment layer 580, the surface 157 of the chip 150A(2) and the surface 514 of the substrate and extend from the window 195 adjacent the end 126. The vent 1210-1, or a plurality of such vents, may be positioned similarly extending from the window 195 as the vents 1002 in the assembly 100.

Referring to FIGS. 19 and 20, during flow of encapsulant in the direction L2, similarly as described for the assembly 500', at the chip 150A(1) the encapsulant material may flow through the bond channel window 1205, from the portions 565A and 565B, and cause air to be forced from the window 1205 into the vent 1210-1, such that the encapsulant may be formed in the window 1205 without voids. In addition, at the chip 150A(2) the encapsulant material may flow through the bond channel window 195, similarly as in the assembly 100, and cause air to be forced from the window 195 into the vent 1210-2, such that the encapsulant may be formed in the window 195 without voids and the forced air is contained in the vent 1201-2.

Figure 22:
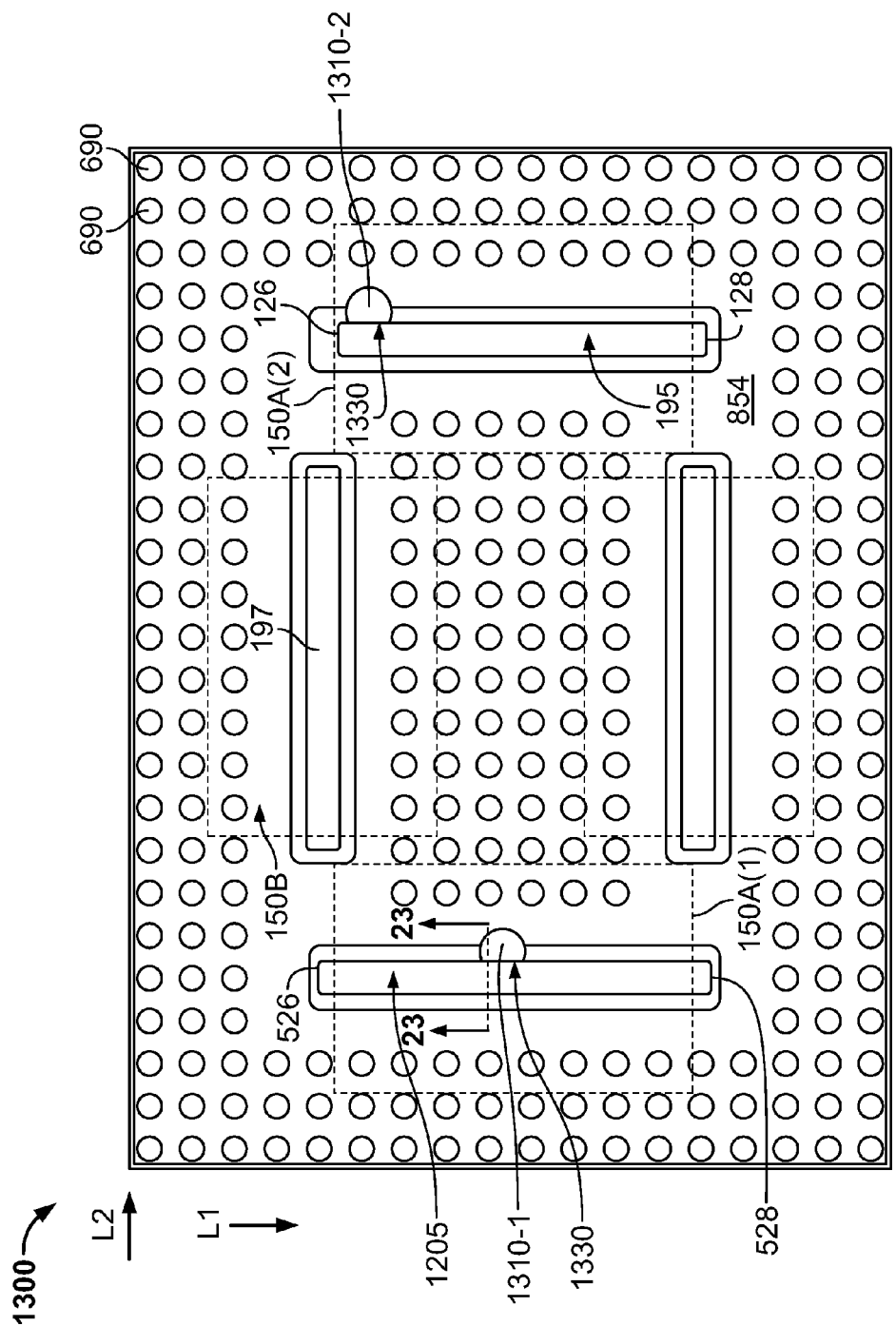
FIG. 22 is a bottom plan view of a microelectronic assembly, according to an embodiment of the disclosure.
Figure 23:
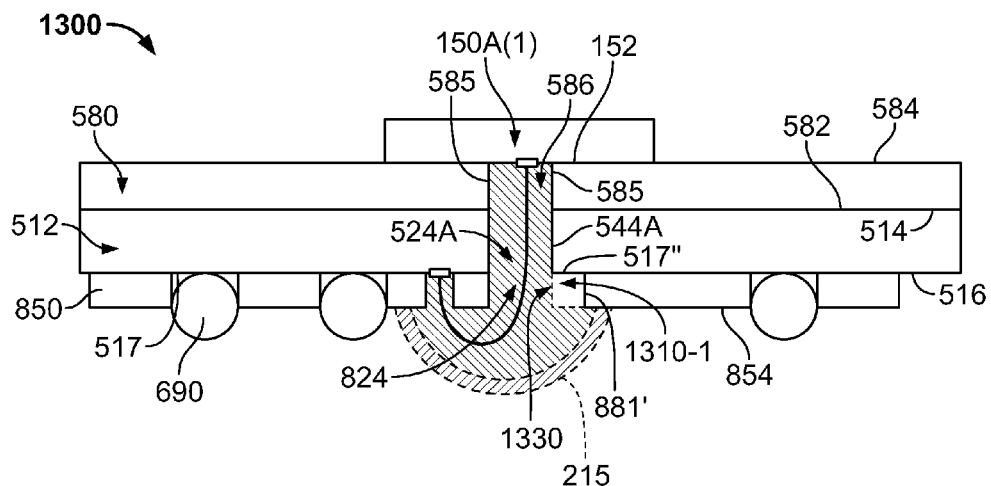
FIG. 23 is a diagrammatic sectional view of the microelectronic assembly as shown in FIG. 22 at cross-sectional line 23-23.

FIGS. 22 and 23 illustrate another embodiment of a microelectronic assembly 1300 according to the disclosure. The assembly 1300 may include chips 150B arranged overlying windows 197 and chips 150A(1) and 150A(2) overlying windows 1205 and 195, respectively, similar to the assembly 1100, except that the vents 1210 are omitted. In such embodiment, photoimageable layer 850 may be formed on the surface 516 of the substrate 512 (see FIG. 11), and configured to define, with portions of the surface 516 of the substrate, vents 1310 extending from the windows 1205 and 195 at the bottom side of the substrate. For example, the vent 1310-1 may be defined by a surface portion 517" of the surface 517 extending from the surface 585 towards an inner surface 881' of the layer 850. The surface 881' may have a configuration similar to the surface 595 in the assembly 1200, to define a recess in the layer 850 extending from an interface 1330 at the window 1205. The vent 1310-1 may extend from the interface 1330 at the window 1205 between the ends 526 and 528, at a similar position along the length of the window as the vent 1210-1. In addition, a vent 1310-2 may extend from the window 195 at the end 126 at a similar position with respect to the opposite end of the window 195 as the vent 1210-2. The interface 1330 may have dimensions of at least about 40,000 square micrometers, so as to permit flow of air therethrough while avoiding flow of encapsulant material therethough.

Referring to FIG. 22, during flow of encapsulant in the direction L2, similarly as described for the assembly 1100, at the chip 150A(1) the encapsulant material may flow through the bond channel window 1205, from the portions 565A and 565B, and cause air to be forced from the portions of the window 1205 into the vent 1310-1 through the interface 1330, such that the encapsulant portion may be formed in the window 1205 without voids. In addition, at the chip 150A(2) the encapsulant material may flow through the bond channel window 195, similarly as in the assembly 1100, and cause air to be forced from the window 195 into the vent 1310-2, such that the encapsulant may be formed in the window 195 without voids. The molding element 215 may have a configuration such that, when positioned at the bottom side of the substrate on the surface 854 of the layer 850, the molding element 215 extends beyond the vents 1310. When encapsulant material is flowed with the mold element 215 positioned in such manner, the vents 1310 are enclosed at the bottom surface during flow of encapsulant material to flow the encapsulant. In other words, as shown in FIG. 23, the vents 1310 may be enclosed by the mold element 215 and, therefore, the vents 1310 are not in fluid communication with the environment at the bottom side of the substrate during flowing of encapsulant material.

In another embodiment, the encapsulation portion formed in the window may extend at least partially into the vents 1210 or 1310.

Figure 24:
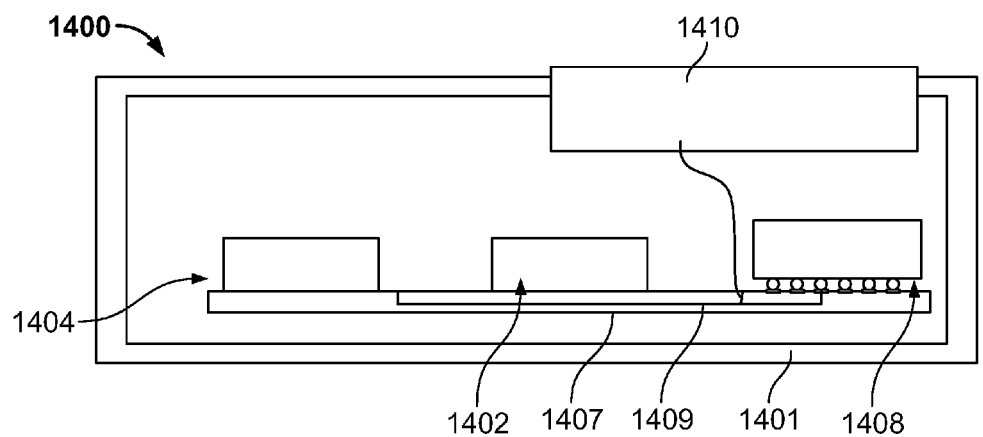
FIG. 24 is a diagrammatic view depicting a system in accordance with the disclosure.

The assemblies discussed above may be utilized in construction of diverse electronic systems. For example, a system 1400 (FIG. 24) in accordance with a further embodiment of the invention includes a first package assembly 1402, such as containing the encapsulated chip 150A of the assembly 100, and a second package assembly 1404, such as containing the encapsulated chip of the assembly 500, and in conjunction with other electronic components 1408 and 1410. In the example depicted, component 1408 is a semiconductor chip whereas component 1410 is a display screen, but any other components may be used. Of course, although only two additional components are depicted in FIG. 24 for clarity of illustration, the system may include any number of such components. Package assemblies 1402 and 1404 and components 1408 and 1410 are mounted to a common housing 1401, schematically depicted in broken lines, and are electrically interconnected with one another as necessary to form the desired circuit. In the exemplary system shown, the system includes a circuit panel 1407 such as a flexible or rigid printed circuit board, and the circuit panel includes numerous conductors 1409, of which only one is depicted in FIG. 24, interconnecting the components with one another. An off-board connector connects component 1410 to the circuit panel. However, this is merely exemplary; any suitable structure for making electrical connections may be used. The housing 1401 is depicted as a portable housing of the type usable, for example, in a cellular telephone or personal digital assistant, and screen 1410 is exposed at the surface of the housing. Again, the simplified system shown in FIG. 24 is merely exemplary; other systems, including systems commonly regarded as fixed structures, such as desktop computers, routers and the like may be made using the packages discussed above.

As these and other variations and combinations of the features discussed above may be utilized without departing from the present invention, the foregoing description of the preferred embodiments should be taken by way of illustration rather than by way of limitation of the invention as defined by the claims.

The invention claimed is:

1. A microelectronic assembly comprising:
   a substrate having an opening extending between first and second oppositely facing surfaces of the substrate, the opening elongated in a first direction; and
   a microelectronic element having a front face facing and attached to the first surface of the substrate and a plurality of contacts at the front face overlying the opening, the microelectronic element having first and second opposite peripheral edges extending away from the front face, wherein the opening extends beyond at least one of the first or second peripheral edges,
   wherein at least one of the first surface or the second surface of the substrate partially defines at least one vent extending from the opening.

2. The assembly of claim 1, wherein the opening extends beyond each of the first and second peripheral edges and the vent is at least a predetermined distance from each of the first and second peripheral edges, the opening having a predetermined length in the first direction and the predetermined distance determined based on the predetermined length.

3. The assembly of claim 1, wherein the opening extends beyond one edge of the first and second peripheral edges and the vent is at least a predetermined distance from the other edge of the first and second peripheral edges, the opening having a predetermined length in the first direction and the predetermined distance determined based on the predetermined length.

4. The assembly of claim 1, wherein the vent extends beyond a peripheral edge of the microelectronic element.

5. The assembly of claim 4, wherein the microelectronic element has a third peripheral edge extending between the first and second peripheral edges and the vent extends beyond the third peripheral edge.

6. The assembly of claim 5, wherein the opening extends beyond each of the first and second peripheral edges and the vent is at least a predetermined distance from each of the first and second edges, the opening having a predetermined length in the first direction and the predetermined distance determined based on the predetermined length.

7. The assembly of claim 4, wherein one of the first and second peripheral edges extends beyond, or is aligned in the first direction with, an inner edge of the opening, and the vent extends from the opening beyond the one peripheral edge.

8. The assembly of claim 4, wherein the vent has a width of between about 200 and 300 micrometers.

9. The assembly of claim 1 further comprising:
an encapsulant contacting at least one of the first or second peripheral edges, wherein the encapsulant extends through the opening beyond the at least one of the first or second peripheral edges and overlies at least a portion of the front face of the microelectronic element.

10. The assembly of claim 9, wherein the encapsulant extends through the opening from the first peripheral edge to the second peripheral edge and to the front face of the microelectronic element.

11. The assembly of claim 9, wherein the encapsulant extends within at least a portion of the vent.

12. The assembly of claim 1 further comprising:
a second microelectronic element having a front face facing and attached to the first surface of the substrate, the second microelectronic element overlying a second opening extending between the first and second surfaces of the substrate and having a plurality of contacts at the front face thereof overlying the second opening, the second microelectronic element having fourth and fifth opposite peripheral edges extending away from the front face thereof,
wherein the second opening extends beyond the fourth and fifth peripheral edges, and
wherein a first line extending from the fourth peripheral edge to the fifth peripheral edge is transverse to a second line extending from the first peripheral edge to the second peripheral edge.

13. The assembly of claim 12, wherein the first and second lines are orthogonal to each other.

14. The assembly of claim 1 further comprising:
a structure overlying one of the substrate surfaces further defining the vent.

15. The assembly of claim 14, wherein the vent is uncovered remote from the opening at a surface of the structure remote from the substrate.

16. The assembly of claim 14, wherein the structure further defining the vent is an attachment layer overlying the first surface of the substrate, the attachment layer attaching the first surface with the front face of the microelectronic element.

17. The assembly of claim 16, wherein the vent is uncovered remote from the opening at a surface of the attachment layer remote from the substrate.

18. The assembly of claim 16, wherein the vent is enclosed by the attachment layer, the first surface of the substrate and the front face of the microelectronic element.

19. The assembly of claim 18, wherein the vent has a volume of about 2,000,000 cubic micrometers.

20. The assembly of claim 18, wherein the vent extends from the opening at an interface having a surface area of about at least 10,000 square micrometers.

21. The assembly of claim 14, wherein the structure further defining the vent is a photoimageable dielectric material layer overlying the second surface of the substrate.

22. The assembly of claim 21, wherein the vent is uncovered remote from the opening at a surface of the photoimageable layer remote from the substrate.

23. The assembly of claim 1, wherein the at least one vent includes first and second vents, the assembly further comprising:
a first structure defining, with the first surface of the substrate, the first vent extending from the opening, the first structure including an attachment layer overlying the first surface of the substrate, the attachment layer attaching the first surface with the front face of the microelectronic element; and
a second structure defining, with the second surface of the substrate, the second vent extending from the opening, the second structure including a photoimageable dielectric material layer overlying the second surface of the substrate.

* * * * *